US011862624B2

(12) United States Patent
Ok et al.

(10) Patent No.: US 11,862,624 B2
(45) Date of Patent: Jan. 2, 2024

(54) INTEGRATED CIRCUIT DEVICE WITH PROTECTIVE ANTENNA DIODES INTEGRATED THEREIN

(71) Applicant: Samsung Electronics Co., Ltd., Suwon-si (KR)

(72) Inventors: Taemin Ok, Cheonan si (KR); Inmo Kim, Hwaseong si (KR); Sujeong Kim, Seoul (KR); Daeseok Byeon, Seongnam-si (KR)

(73) Assignee: Samsung Electronics Co., Ltd.

( * ) Notice: Subject to any disclaimer, the term of this patent is extended or adjusted under 35 U.S.C. 154(b) by 254 days.

(21) Appl. No.: 17/325,821

(22) Filed: May 20, 2021

(65) Prior Publication Data

US 2022/0139904 A1 May 5, 2022

(30) Foreign Application Priority Data

Nov. 4, 2020 (KR) .......................... 10-2020-0146195

(51) Int. Cl.
*H01L 27/02* (2006.01)
*H01L 23/538* (2006.01)
*H01L 27/06* (2006.01)
*H10B 41/27* (2023.01)
*H10B 43/27* (2023.01)

(52) U.S. Cl.
CPC ...... *H01L 27/0255* (2013.01); *H01L 23/5384* (2013.01); *H01L 23/5386* (2013.01); *H01L 27/0629* (2013.01); *H10B 41/27* (2023.02); *H10B 43/27* (2023.02)

(58) Field of Classification Search
CPC ...... H01L 27/0255; H10B 41/40; H10B 43/40
See application file for complete search history.

(56) References Cited

U.S. PATENT DOCUMENTS

| | | | |
|---|---|---|---|
| 9,379,042 B2 | 6/2016 | Park et al. | |
| 9,852,965 B2 | 12/2017 | Lee et al. | |
| 9,953,993 B2 | 4/2018 | Utsumi et al. | |
| 10,580,787 B2 | 3/2020 | Nishikawa et al. | |
| 10,665,598 B2 | 5/2020 | Nagashima et al. | |
| 2018/0012903 A1 | 1/2018 | Kim et al. | |
| 2019/0371800 A1* | 12/2019 | Nishikawa | H10B 41/35 |
| 2020/0058669 A1 | 2/2020 | Chen et al. | |
| 2021/0183879 A1* | 6/2021 | Ahn | H01L 27/0255 |
| 2022/0285383 A1* | 9/2022 | Kubota | H01L 27/0255 |

* cited by examiner

*Primary Examiner* — Selim U Ahmed
*Assistant Examiner* — Evan G Clinton
(74) *Attorney, Agent, or Firm* — Myers Bigel, P.A.

(57) ABSTRACT

An integrated circuit device includes a semiconductor substrate having components of a peripheral circuit structure formed in and on a surface of the semiconductor substrate. The peripheral circuit structure comprising a plurality of protective antenna diodes therein. A memory cell array structure is provided on at least a portion of the peripheral circuit structure. A charge accumulating conductive plate is provided, which extends between the peripheral circuit structure and the memory cell array structure. The conductive plate is electrically connected to current carrying terminals of the antenna diodes within the peripheral circuit structure. The conductive plate may have a generally rectangular planar shape with four corners, and the antenna diodes may be arranged into four groups, which extend between respective corners of the conductive plate and the semiconductor substrate.

18 Claims, 20 Drawing Sheets

INTEGRATED CIRCUIT DEVICE WITH PROTECTIVE ANTENNA DIODES INTEGRATED THEREIN

REFERENCE TO PRIORITY APPLICATION

This application claims priority to Korean Patent Application No. 10-2020-0146195, filed Nov. 4, 2020, the disclosure of which is hereby incorporated herein by reference.

BACKGROUND

The inventive concept relates to integrated circuit (IC) devices and, more particularly, to integrated circuit memory devices and methods of fabricating the same.

As information and communication devices become multifunctional, IC devices including memory devices are increasing in capacity and becoming more highly integrated. In addition, memory cells are being downscaled in size, and operating circuits and wiring structures included in memory devices for operations and electrical connection of the memory devices are becoming more complex. Accordingly, IC devices having improved integration density and memory devices having structures with excellent electrical properties are required.

SUMMARY

The inventive concept provides an integrated circuit (IC) device having a structure capable of supporting excellent electrical properties in a highly integrated memory device.

According to an aspect of the inventive concept, there is provided an IC device, which includes a lower substrate, a peripheral circuit structure including a plurality of antenna diodes formed in the lower substrate, and a conductive plate including a tile region and an edge region surrounding the tile region. The conductive plate covers at least a portion of the peripheral circuit structure. A memory cell array structure overlaps the peripheral circuit structure with the tile region of the conductive plate therebetween in a vertical direction. A plurality of bypass wiring structures are connected between the plurality of antenna diodes and the conductive plate. The plurality of antenna diodes are preferably located under the edge region of the conductive plate.

According to another aspect of the inventive concept, there is provided an IC device, which includes a lower substrate and a peripheral circuit structure formed in the lower substrate. The peripheral circuit structure includes a plurality of antenna diodes and a peripheral circuit in a diode region. A conductive plate includes a tile region having a rectangular planar shape and an edge region extending along an edge of the tile region and surrounding the tile region. The conductive plate covers the peripheral circuit structure. A cell array structure overlaps the peripheral circuit structure with the tile region of the conductive plate therebetween in a vertical direction. The cell array structure includes a memory stack (e.g., 3D nonvolatile memory). The memory stack includes a plurality of gate lines stacked in the vertical direction, a plurality of channel structures passing through the plurality of gate lines in the vertical direction, and a plurality of bit lines on the plurality of channel structures. A plurality of bypass wiring structures are connected between the plurality of antenna diodes and the conductive plate. The diode region may be located under portions of the edge region of the conductive plate, which are respectively adjacent to vertex portions of the tile region of the conductive plate.

According to another aspect of the inventive concept, there is provided an IC device, which includes a lower substrate and a peripheral circuit structure in the lower substrate. The peripheral circuit structure includes a plurality of antenna diodes and a peripheral circuit. A conductive plate includes a tile region having a rectangular planar shape and an edge region extending along an edge of the tile region and completely surrounding the tile region. The conductive plate covers the peripheral circuit structure. A cell array structure overlaps the peripheral circuit structure with the tile region of the conductive plate therebetween in a vertical direction. The cell array structure includes a memory stack. The memory stack includes a plurality of gate lines stacked in the vertical direction, a plurality of channel structures passing through the plurality of gate lines in the vertical direction, and a plurality of bit lines on the plurality of channel structures. The plurality of bit lines are connected to the plurality of channel structures through a plurality of contact pads. A plurality of bypass wiring structures connect diode ion implantation regions included in the plurality of antenna diodes to the edge region of the conductive plate. Each of the bypass wiring structures has a bypass via contact having an upper surface in contact with a lower surface of the edge region of the conductive plate. The plurality of antenna diodes are located in diode regions that are respectively under portions of the edge region of the conductive plate, which are respectively adjacent to vertex portions of the tile region of the conductive plate.

An integrated circuit device according to another aspect of the inventive concept includes a semiconductor substrate having components of a peripheral circuit structure formed in and on a surface of the semiconductor substrate. The peripheral circuit structure includes a plurality of antenna diodes therein. A memory cell array structure (e.g., 3D NAND-type memory) is provided on at least a portion of the peripheral circuit structure. A conductive plate is provided which extends between the peripheral circuit structure and the memory cell array structure. The conductive plate is electrically connected to current carrying terminals of the antenna diodes within the peripheral circuit structure. In addition, the conductive plate may have a generally rectangular planar shape with four corners, and the antenna diodes may be arranged into four groups that extend between respective corners of the conductive plate and the semiconductor substrate. Bypass wiring structures may also be provided, which electrically connect the current carrying terminals of the antenna diodes to the conductive plate. The memory cell array structure may also extend on a first portion of the conductive plate, which is surrounded by a second portion of the conductive plate. And, the antenna diodes may extend between the second portion of the conductive plate and the semiconductor substrate. The first portion of the conductive plate may have a generally rectangular shape, and the second portion of the conductive plate may surround the first portion of the conductive plate on all sides thereof.

According to further embodiments of the inventive concept, a bit line is provided on the memory cell array, and electrically conductive through-hole via (THV) is provided, which extends through an opening (PH) in the conductive plate, and electrically connects the bit line to a portion of the peripheral circuit structure. In addition, the conductive plate may be configured as a stacked plurality of layers of electrically conductive materials, which are different from each other. The memory cell array structure may also have a word line cut (WLC) region therein, which extends at least partially through the memory cell structure to a surface of the conductive plate. The plurality of antenna diodes may also be arranged into first through fourth arrays of antenna diodes, which have respective first through fourth pluralities of anode terminals that contact respective first through fourth portions of the conductive plate, and which are located adjacent first through fourth corners of the conductive plate when viewed from a plan perspective. In some embodiments, these first through fourth portions of the conductive plate are not covered by the memory cell array structure when viewed from the plan perspective.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
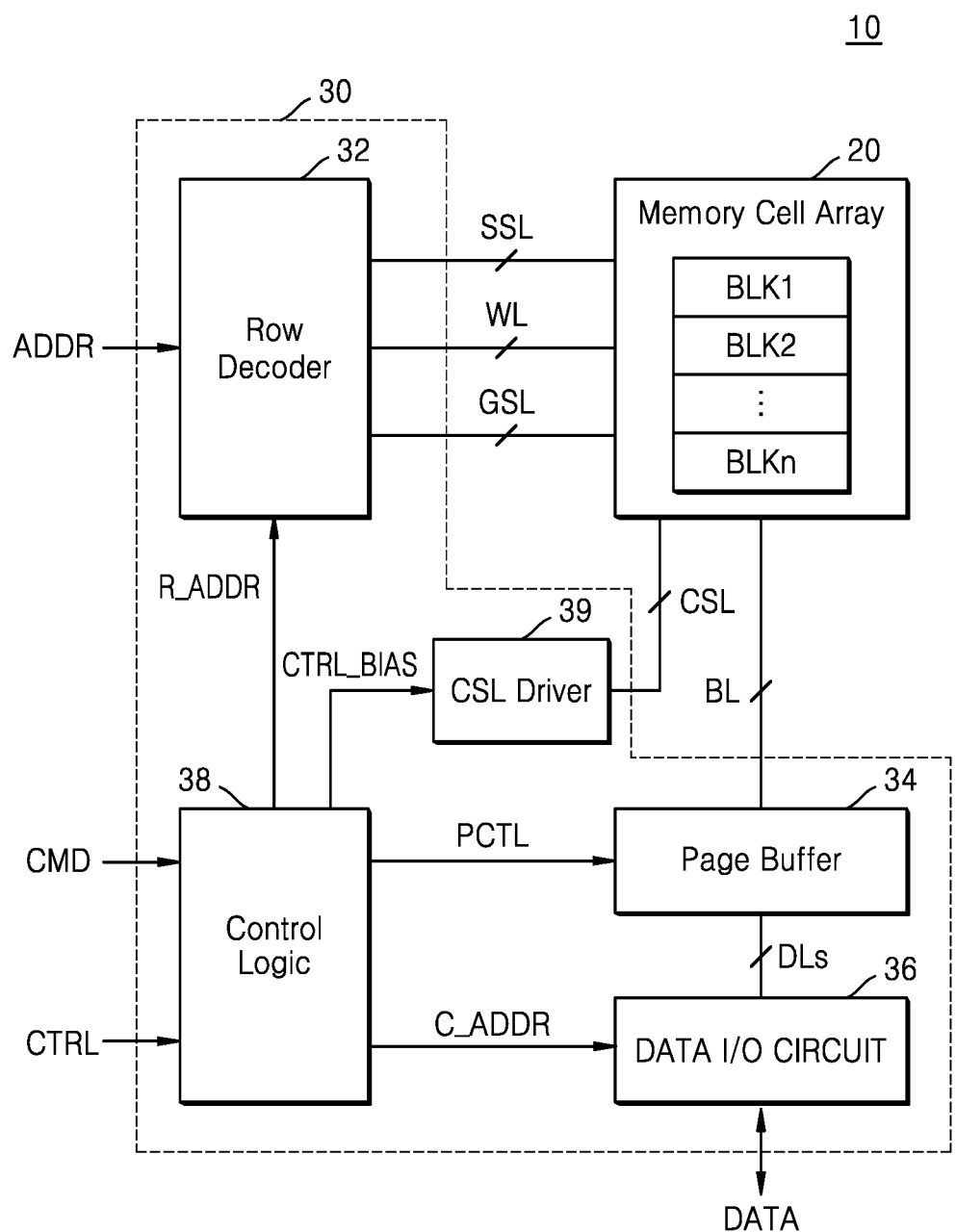
FIG. 1 is a block diagram of an integrated circuit (IC) device according to example embodiments.

FIG. 1 is a block diagram of an integrated circuit (IC) device 10 according to example embodiments. Referring to FIG. 1, the IC device 10 may include a memory cell array 20 and a peripheral circuit 30. The memory cell array 20 may include a plurality of memory cell blocks BLK1, BLK2, ..., and BLKn. Each of the plurality of memory cell blocks BLK1, BLK2, ..., and BLKn may include a plurality of memory cells. The memory cell blocks BLK1, BLK2, ..., and BLKn may be connected to the peripheral circuit 30 through bit lines BL, word lines WL, string selection lines SSL, and a ground selection line GSL.

The peripheral circuit 30 may include a row decoder 32, a page buffer 34, a data input/output (I/O) circuit 36, a control logic 38, and a common source line (CSL) driver 39. Although not shown in FIG. 1, the peripheral circuit 30 may further include various circuits, such as a voltage generation circuit configured to generate various voltages required for operations of the IC device 10, an error correction circuit configured to correct errors in data read from the memory cell array 20, and an I/O interface.

The memory cell array 20 may be connected to the page buffer 34 through the bit lines BL and connected to the row decoder 32 through the word lines WL, the string selection lines SSL, and the ground selection line GSL. In the memory cell array 20, each of the plurality of memory cells included in the plurality of memory cell blocks BLK1, BLK2, ..., and BLKn may be a flash memory cell. The memory cell array 20 may include a three-dimensional (3D) memory cell array. The 3D memory cell array may include a plurality of NAND strings, each of which includes a plurality of memory cells respectively connected to a plurality of word lines WL stacked in a vertical direction.

The peripheral circuit 30 may receive an address ADDR, a command CMD, and a control signal CTRL from the outside of the IC device 10 and transmit and receive data DATA to and from a device located outside the IC device 10. The row decoder 32 may select at least one of the plurality of memory cell blocks BLK1, BLK2, ..., and BLKn in response to an address ADDR received from the outside and select a word line WL, a string selection line SSL, and a ground selection line GSL of the selected memory cell block. The row decoder 32 may transmit a voltage for performing a memory operation to the word line WL of the selected memory cell block.

The page buffer 34 may be connected to the memory cell array 20 through the bit line BL. During a program (i.e., write) operation, the page buffer 34 may operate as a write driver and apply a voltage corresponding to data DATA to be stored in the memory cell array 20 to the bit line BL. During a read operation, the page buffer 34 may operate as a sense amplifier and sense the data DATA stored in the memory cell array 20. The page buffer 34 may operate in response to a control signal PCTL provided from the control logic 38.

The data I/O circuit 36 may be connected to page buffer 34 through data lines DLs. In the program operation, the data I/O circuit 36 may receive data DATA from a memory controller (not shown) and provide program data DATA to the page buffer 34 based on a column address C_ADDR provided from the control logic 38. In the read operation, the data I/O circuit 36 may provide read data DATA, which is stored in the page buffer 34, to the memory controller based on the column address C_ADDR provided from the control logic 38. The data I/O circuit 36 may transmit an input address or instruction to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and provide a column address C_ADDR to the data I/O circuit 36. The control logic 38 may generate various internal control signals used in the IC device 10, in response to the control signal CTRL. For example, the control logic 38 may adjust voltage levels of voltages provided to the word line WL and the bit line BL during a memory operation, such as a program operation or an erase operation.

The CSL driver 39 may be connected to the memory cell array 20 through the common source line CSL. The CSL driver 39 may apply a common source voltage (e.g., a power supply voltage) or a ground voltage to the common source line CSL via the control of the control logic 38. In example embodiments, the CSL driver 39 may be under the memory cell array 20. The CSL driver 39 may vertically overlap at least a portion of the memory cell array 20. Advantageously, to prevent charges capable of generating a large current (e.g., due to arcing) from being accumulated in a conductive plate (e.g., a conductive plate 110 shown in FIG. 11), the peripheral circuit 30 may further include an antenna diode (e.g. an antenna diode D40 shown in FIG. 11), which may bypass the charges to a lower substrate (e.g., a lower substrate 52 shown in FIG. 11) through a wiring structure (e.g., a bypass wiring structure P81 shown in FIG. 11 or a bypass wiring structure P280 shown in FIG. 12) under the memory cell array 20.

As will be understood by those skilled in the art, arcing refers to a breakdown phenomenon whereby an electric arc occurs between conductors, which are spaced apart from each other by an insulator, due to a potential difference caused between the conductors. For example, when a process using plasma is performed after a conductive plate (refer to 110 in FIG. 17) is formed, charges may be accumulated due to plasma in a plate piece, which is a portion of the conductive plate 110. Here, a plasma discharge path may be absent between the plate piece and the lower substrate 52. The charges accumulated in the plate piece may cause an arc discharge, which can degrade the peripheral circuit 30, such as the CSL driver 39. Fortunately, the antenna diode D40 shown in FIG. 11 may provide a plasma discharge path between the plate piece and the lower substrate 52 and prevent arcing from occurring.

Figure 2:
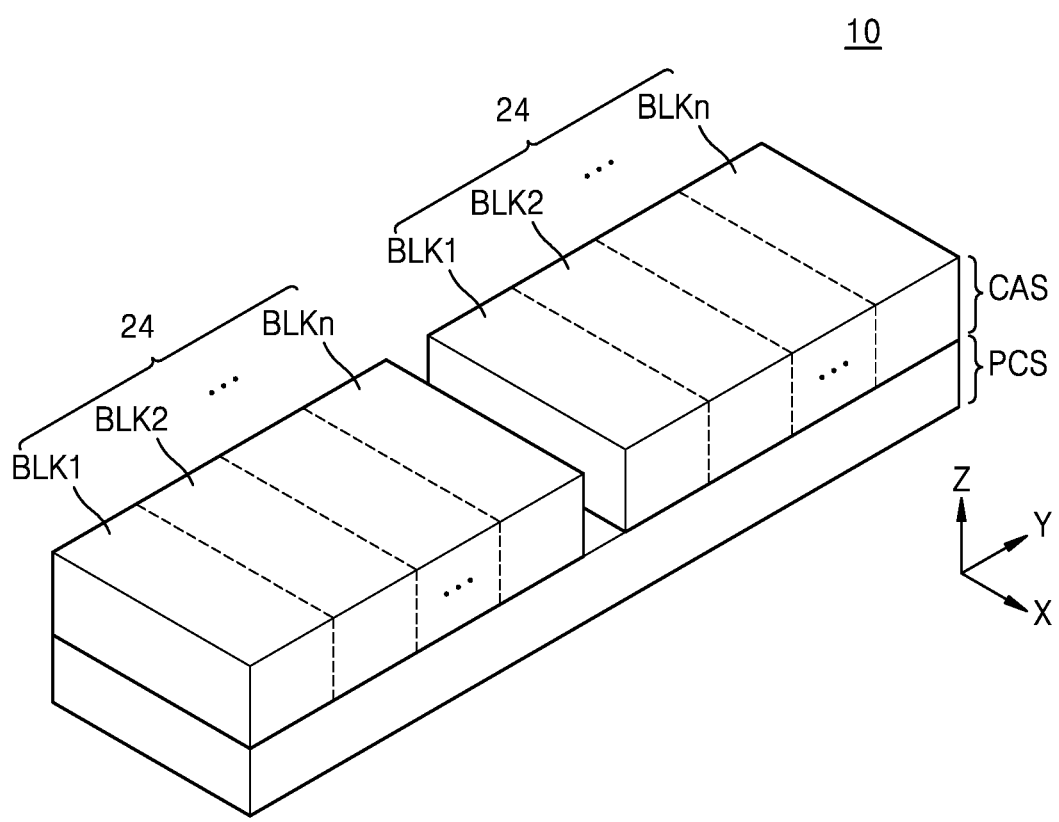
FIG. 2 is a schematic perspective view of an IC device according to example embodiments.

FIG. 2 is a schematic perspective view of an IC device 10 according to example embodiments. Referring to FIG. 2, the IC device 10 may include a cell array structure CAS and a peripheral circuit structure PCS, which overlap each other in a vertical direction (Z direction). The cell array structure CAS may include the memory cell array 20 described with reference to FIG. 1. The peripheral circuit structure PCS may include the peripheral circuit 30 described with reference to FIG. 1.

The cell array structure CAS may include a plurality of tiles 24. Each of the plurality of tiles 24 may include a plurality of memory cell blocks BLK1, BLK2, . . . , and BLKn. Each of the plurality of memory cell block BLK1, BLK2, BLKn may include memory cells arranged three-dimensionally. In some embodiments, two tiles 24 may constitute one mat, without being limited thereto. The memory cell array 20 described with reference to FIG. 1 may include a plurality of mats, for example, four mats, without being limited thereto.

Figure 3:
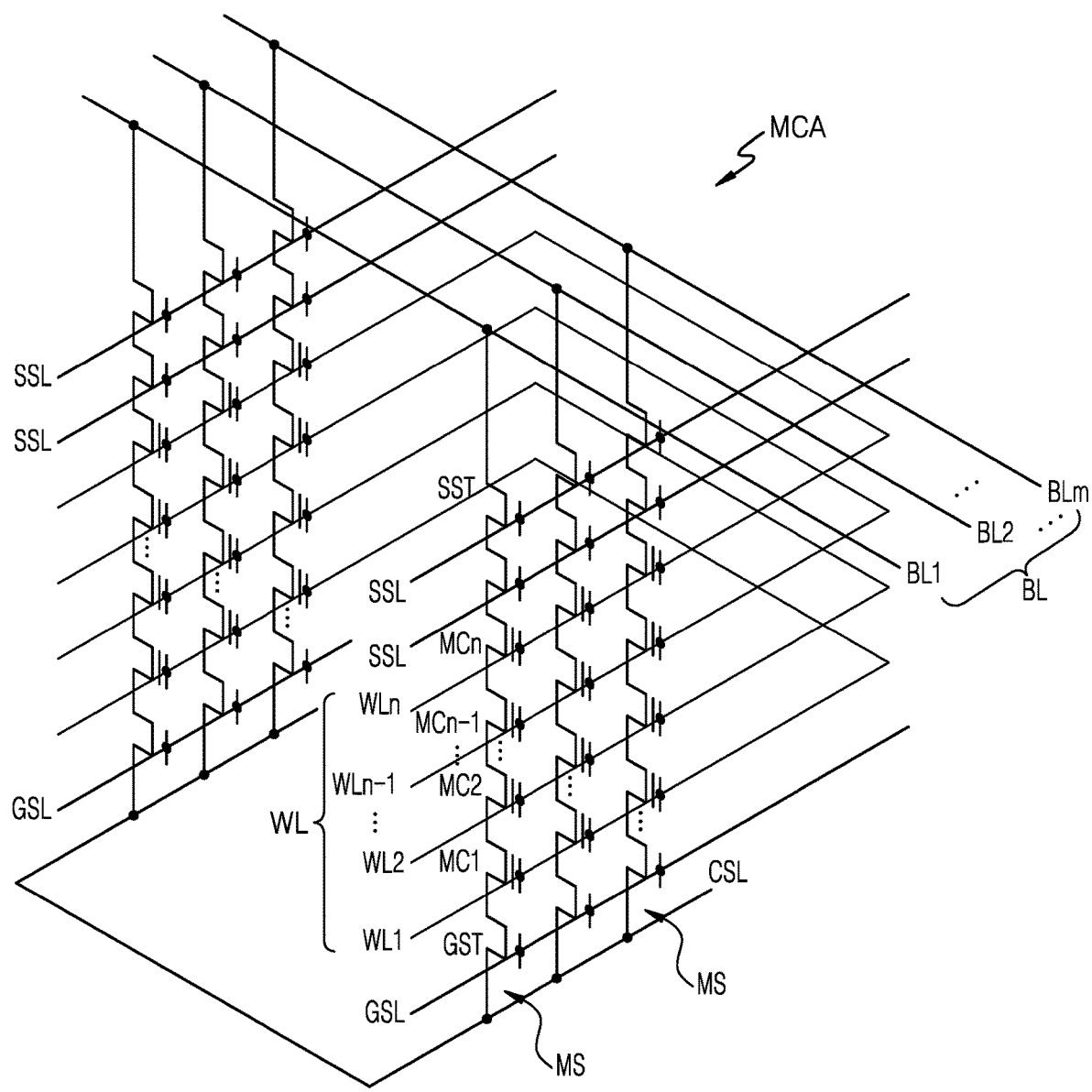
FIG. 3 is an equivalent circuit diagram of a memory cell array of an IC device, according to example embodiments.

FIG. 3 is an equivalent circuit diagram of a memory cell array MCA of an IC device, according to example embodiments. FIG. 3 is an equivalent circuit diagram of an example of a vertical NAND (VNAND) flash memory device having a vertical channel structure. Each of the plurality of memory cell blocks BLK1, BLK2, . . . , and BLKn shown in FIG. 2 may include a memory cell array MCA having a circuit configuration shown in FIG. 3.

Referring now to FIG. 3, the memory cell array MCA may include a plurality of memory cell strings MS. The memory cell array MCA may include a plurality of bit lines BL (or BL1, BL2, . . . , and BLm), a plurality of word lines WL (or WL1, WL2, . . . , WLn−1, and WLn), at least one string selection line SSL, at least one ground selection line GSL, and a common source line CSL. A plurality of memory cell strings MS may be formed between the plurality of bit lines BL and the common source line CSL. Although FIG. 3 illustrates a case in which each of the plurality of memory cell strings MS includes two string selection lines SSL, the inventive concept is not limited thereto. For instance, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn−1, and MCn. A drain region of the string selection transistor SST may be connected to the bit line BL, and a source region of the ground selection transistor GST may be connected to the common source line CSL. The common source line CSL may be a region to which source regions of a plurality of ground selection transistors GST are connected in common.

The string selection transistor SST may be connected to the string selection line SSL, and the ground selection transistor GST may be connected to the ground selection line GSL. The plurality of memory cell transistors MC1, MC2, . . . , MCn−1, and MCn may be respectively connected to the plurality of word lines WL.

Figure 4:
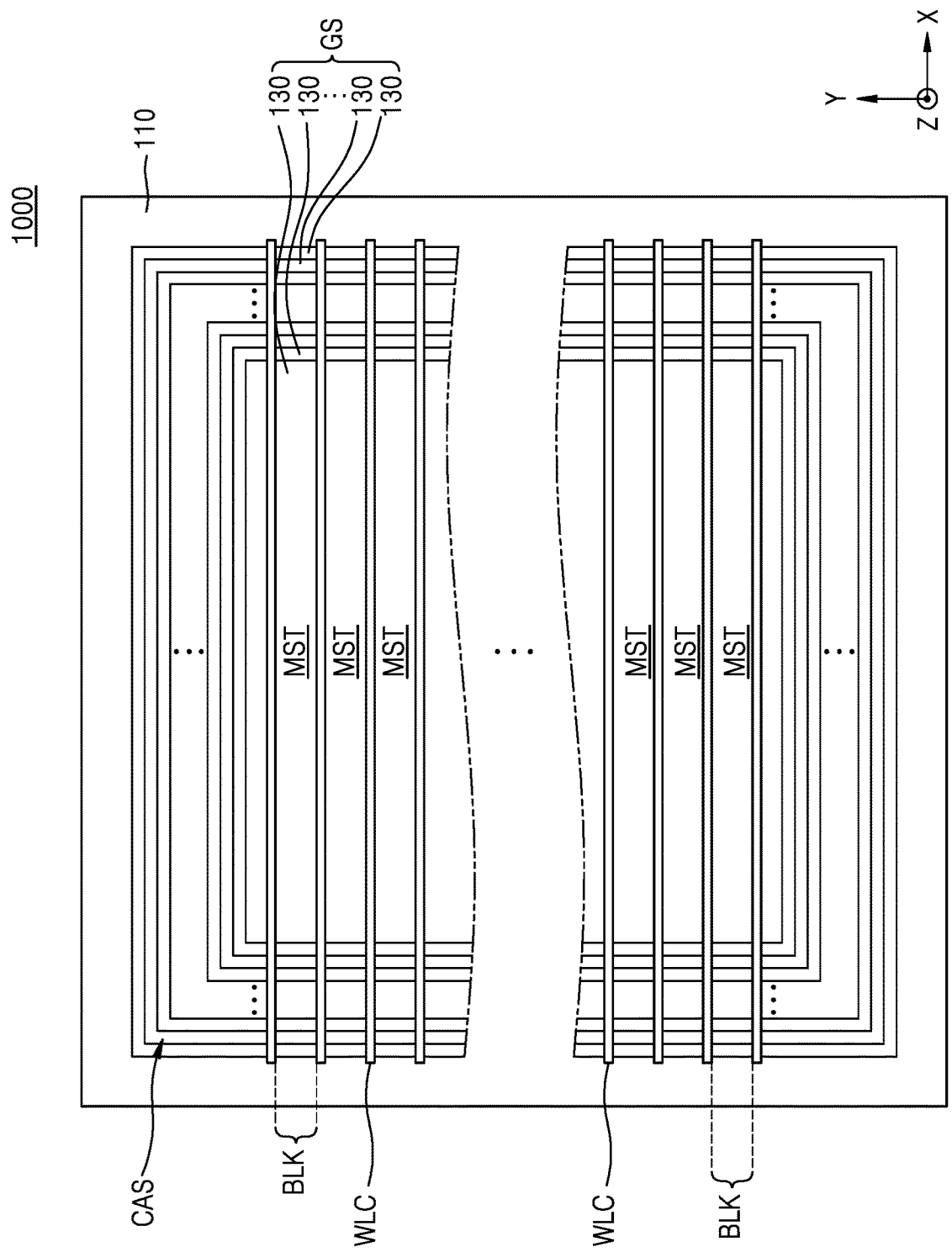
FIG. 4 is a schematic plan view of an IC device according to example embodiments.

FIG. 4 is a schematic plan view of an IC device 1000 according to example embodiments. Referring to FIG. 4, the IC device 1000 may include a cell array structure CAS on a conductive plate 110. The conductive plate 110 and the cell array structure CAS may constitute a memory cell array 20 of the IC device 10 shown in FIG. 1. The conductive plate 110 may serve as the common source line CSL shown in FIG. 3. The conductive plate 110 may support the cell array structure CAS. As used herein, the term "conductive plate" may also be referred to as a "plate CSL," and the "conductive plate" and may be synonymous with the "plate CSL."

The cell array structure CAS may include a plurality of memory cell blocks BLK. A plurality of memory cell blocks BLK, which constitute one tile 24 in the cell array structure CAS, may include the plurality of memory cell blocks BLK1, BLK2, . . . , and BLKn shown in FIG. 2. In example embodiments, the conductive plate 110 may provide a path through which a common source voltage is transmitted to the cell array structure CAS.

The IC device 1000 may include a peripheral circuit structure (refer to PCS in FIG. 2) under the cell array structure CAS. The peripheral circuit structure PCS may include the peripheral circuit 30 described with reference to FIG. 1. The cell array structure CAS may overlap the peripheral circuit structure PCS with the conductive plate 110 therebetween in a vertical direction (Z direction).

The cell array structure CAS may include a plurality of gate lines 130, which are sequentially stacked on the conductive plate 110 in the vertical direction (Z direction). Areas of the plurality of gate lines 130 in an X-Y plane may be gradually reduced as a distance from the conductive plate 110 increases. The plurality of gate lines 130 may be divided into a plurality of blocks BLK by a plurality of word line cut regions WLC, which extend long in a first lateral direction (X direction). A plurality of gate lines 130 included in each of the plurality of blocks BLK may constitute a gate stack GS. Each of the plurality of block BLK may include a memory stack MST including one gate stack GS. In each of a plurality of memory stacks MST, the plurality of gate lines 130 may constitute the ground selection line GSL, the plurality of word lines WL, and the string selection line SSL, which are shown in FIG. 3.

Figure 5:
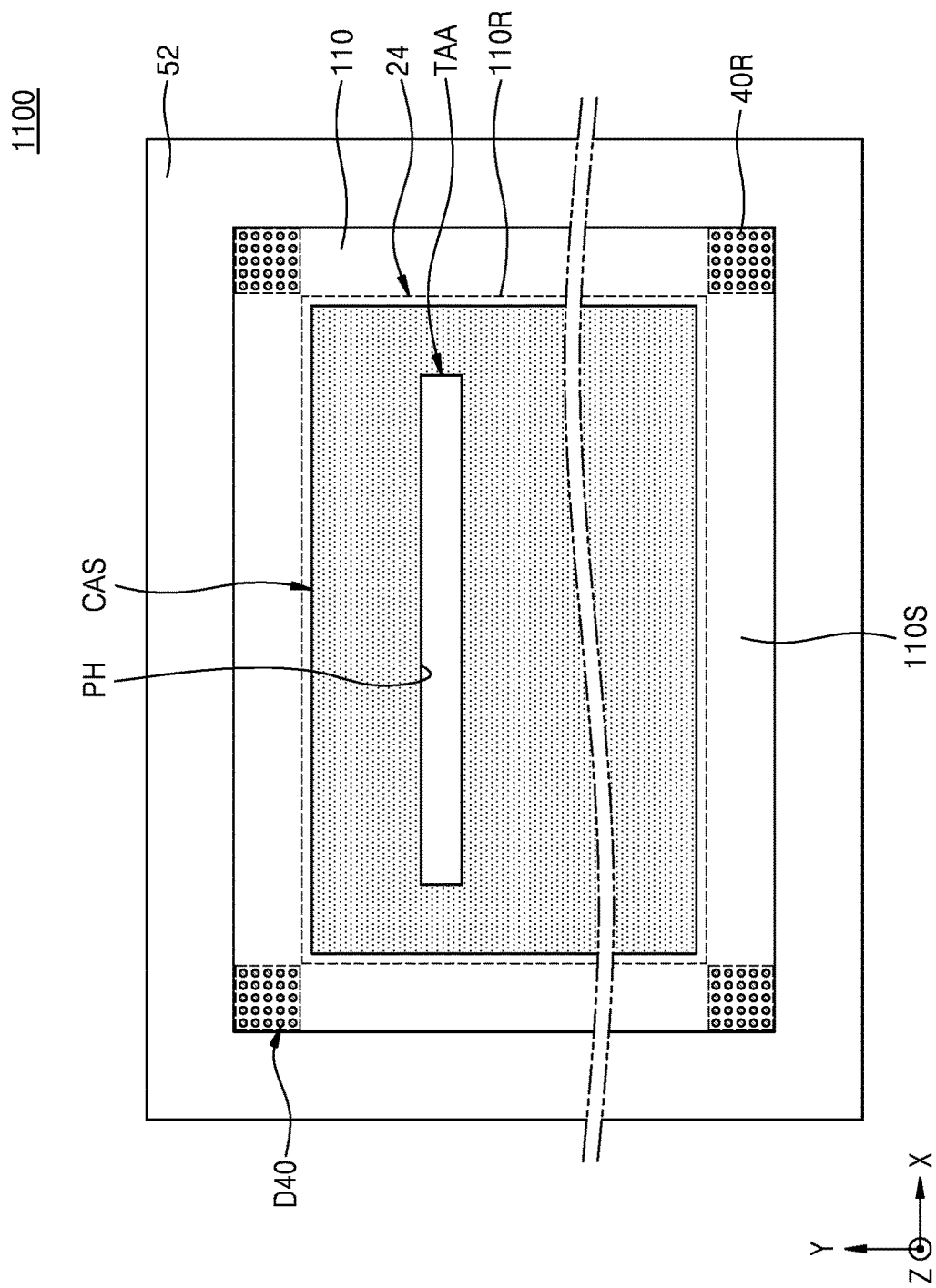
FIG. 5 is a schematic plan view illustrating a planar arrangement of some components of an IC device, according to example embodiments.

FIG. 5 is a schematic plan view illustrating a planar arrangement of some components of an IC device 1100, according to example embodiments. Referring to FIG. 5, in the IC device 1100, a lower substrate 52 and a conductive plate 110 may vertically overlap each other, and the conductive plate 110 may include a tile region 110R located at a position corresponding to one tile 24. An edge of the tile region 110R, in which a cell array structure CAS is located, may be apart from an edge of the conductive plate 110. The conductive plate 110 may further include an edge region 110S surrounding the tile region 110R. The edge region 110S may be a portion of the conductive plate 110 between the edge of the tile region 110R and the edge of the conductive plate 110. The edge region 110S may extend along the edge of the tile region 110R and completely surround the tile region 110R.

The cell array structure CAS may be on the tile region 110R of the conductive plate 110, and a through electrode region TAA may be in a partial region of the conductive plate 110, which is under the cell array structure CAS. At least one through hole PH may be formed in the through electrode region TAA. In some embodiments, the through electrode region TAA may extend long in a first lateral direction (X direction) parallel to the word line cut region WLC shown in FIG. 11. The through hole PH may pass through the conductive plate 110. The through electrode region TAA may be at any one of various positions in the tile region 110R of the conductive plate 110. For example, the through electrode region TAA may be substantially in a central portion of the tile region 110R in a second lateral direction (Y direction), but the inventive concept is not limited thereto.

The peripheral circuit structure PCS described with reference to FIG. 2 may be under the conductive plate 110. The cell array structure CAS may overlap the peripheral circuit structure PCS with the tile region 110R of the conductive plate 110 therebetween in a vertical direction (Z direction). A detailed configuration of the cell array structure CAS may be the same as that presented with reference to FIGS. 2, 3, 4, and 11. The through electrode region TAA may have the same configuration as the through electrode region TA shown in FIG. 11.

Although FIG. 5 illustrates a case in which the tile region 110R has a greater horizontal area than the cell array structure CAS, the tile region 110R may refer to a portion of the conductive plate 110 in which the cell array structure CAS is located. For example, the tile region 110R and the cell array structure CAS may have substantially the same horizontal area and completely vertically overlap each other. In addition, in some embodiments, a horizontal width and a horizontal area of the lower substrate 52 may be greater than those of the conductive plate 110. An edge of the lower substrate 52 may be apart from the edge of the conductive plate 110. A diode region 40R, in which a plurality of antenna diodes D40 are formed, may be under a portion of the edge region 110S, which is adjacent to a vertex of the tile region 110R. The diode region 40R may be under a portion of the edge region 110S, which is adjacent to a vertex of the conductive plate 110.

In some embodiments, each of the conductive plate 110 and the tile region 110R may have a rectangular planar shape having four vertices. Four diode regions 40R, which are apart from each other, may be under portions of the edge region 110S of the conductive plate 110 corresponding to one tile 24. Here, the portions of the edge region 110S may be adjacent to four vertices of the tile region 110R or vertices of the conductive plate 110. That is, the diode regions 40R may be under portions of the edge region 110S, which are between vertices of the tile region 110R and the vertices of the conductive plate 110, which correspond to each other. In some embodiments, the diode region 40R may have a rectangular planar shape, without being limited thereto. In some embodiments, the plurality of antenna diodes D40 may be apart from each other in the diode region 40R and arranged in rows and columns in a matrix form.

Figure 6:
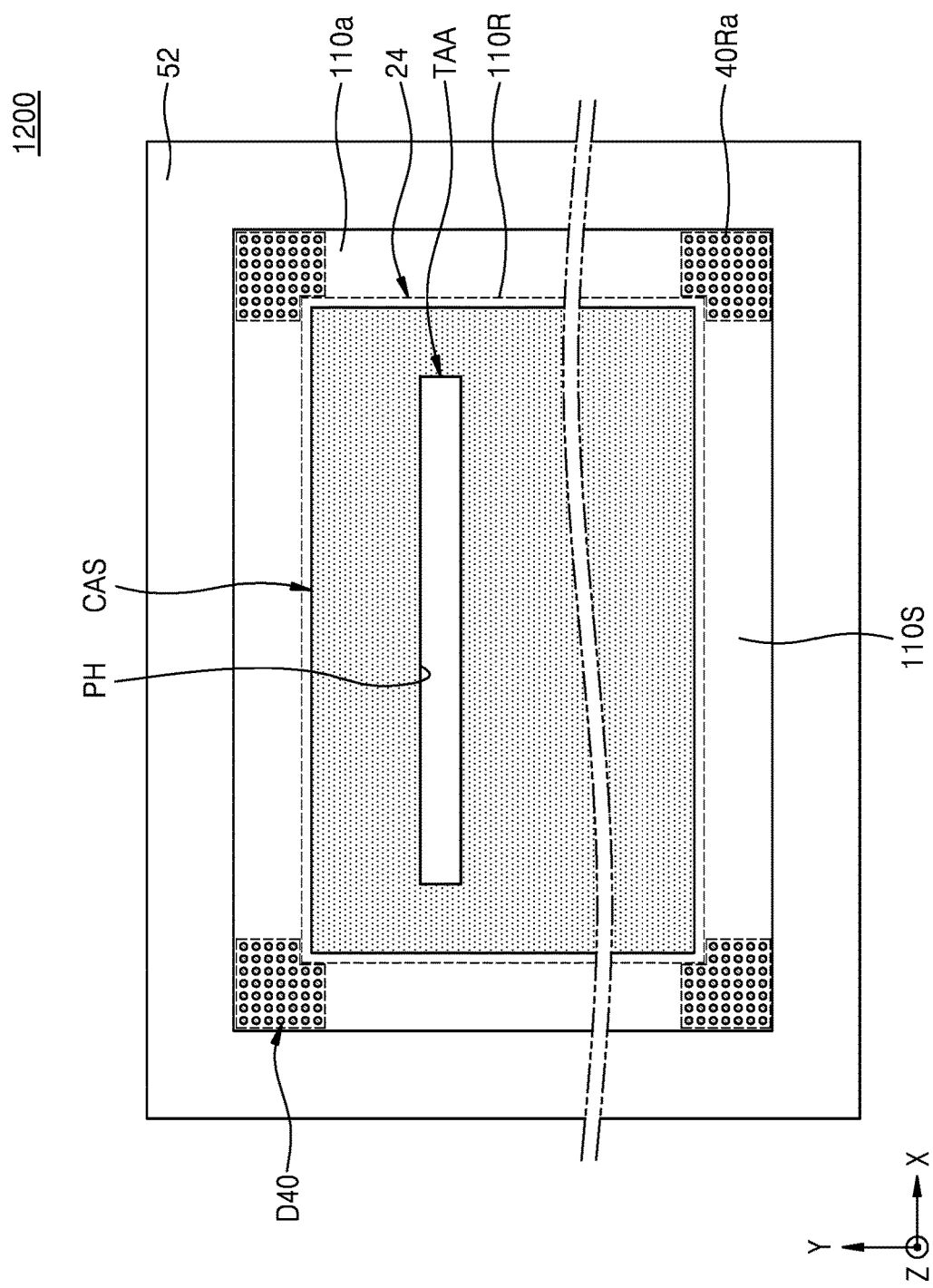
FIG. 6 is a schematic plan view illustrating a planar arrangement of some components of an IC device, according to example embodiments.

FIG. 6 is a schematic plan view illustrating a planar arrangement of some components of an IC device 1200, according to further embodiments. Referring to FIG. 6, the IC device 1200 may have a diode region 40Ra, which is different than the diode region 40R included in the IC device 1100 shown in FIG. 5. A plurality of antenna diodes D40 may be formed in the diode region 40Ra. In some embodiments, the diode region 40Ra may have an L-shaped planar shape. In some embodiments, the plurality of antenna diodes D40 may be apart from each other in the diode region 40Ra and arranged in rows and columns in a matrix form.

Figure 7:
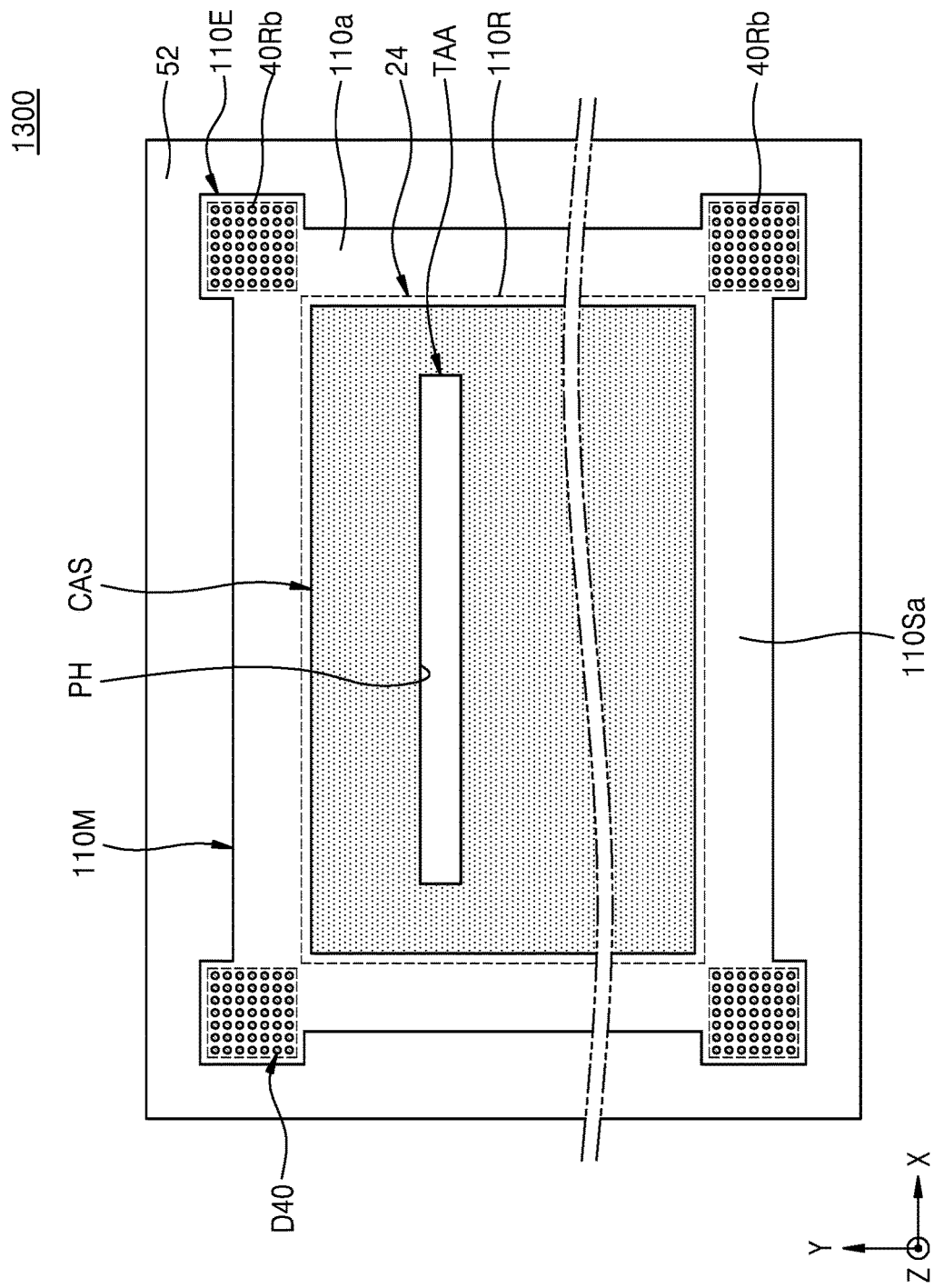
FIG. 7 is a schematic plan view illustrating a planar arrangement of some components of an IC device, according to example embodiments.

FIG. 7 is a schematic plan view illustrating a planar arrangement of some components of an IC device 1300, according to example embodiments. Referring to FIG. 7, instead of the diode region 40R, which is under the portion of the edge region 110S, which is adjacent to the vertex of the tile region 110R in the conductive plate 110 of the IC device 1100, as shown in FIG. 5, the IC device 1300 may have a diode region 40Rb, which is under a portion of an edge region 110Sa of a conductive plate 110a, which is adjacent to a vertex of a tile region 110R. The edge region 110Sa may be a portion of the conductive plate 110a between an edge of the tile region 110R and an edge of the conductive plate 110a. A plurality of antenna diodes D40 may be formed in the diode region 40Rb.

The conductive plate 110a may have a plate extension unit 110E, which extends outward from a vertex portion of a plate main unit 110M having a rectangular planar shape, as shown. The plate main unit 110M may have a portion corresponding to the conductive plate 110 shown in FIGS. 5 and 6. In some embodiments, the plate extension unit 110E may have an L planar shape surrounding the vertex portion of the plate main unit 110M having the rectangular planar shape. In the conductive plate 110a of the IC device 1300, the plate main unit 110M corresponding to the conductive plate 110 of the IC device 1100 shown in FIG. 5 may be integrally formed with the plate extension unit 110E.

As shown in plan view, the diode region 40Rb may be under the plate extension unit 110E of the conductive plate 110a and under a portion of the edge region 110Sa adjacent to the plate extension unit 110E. In some embodiments, the diode region 40Rb may have a rectangular planar shape, without being limited thereto. In some other embodiments, the plurality of antenna diodes D40 may be apart from each other in the diode region 40Rb and arranged in rows and columns in a matrix form.

Figure 8:
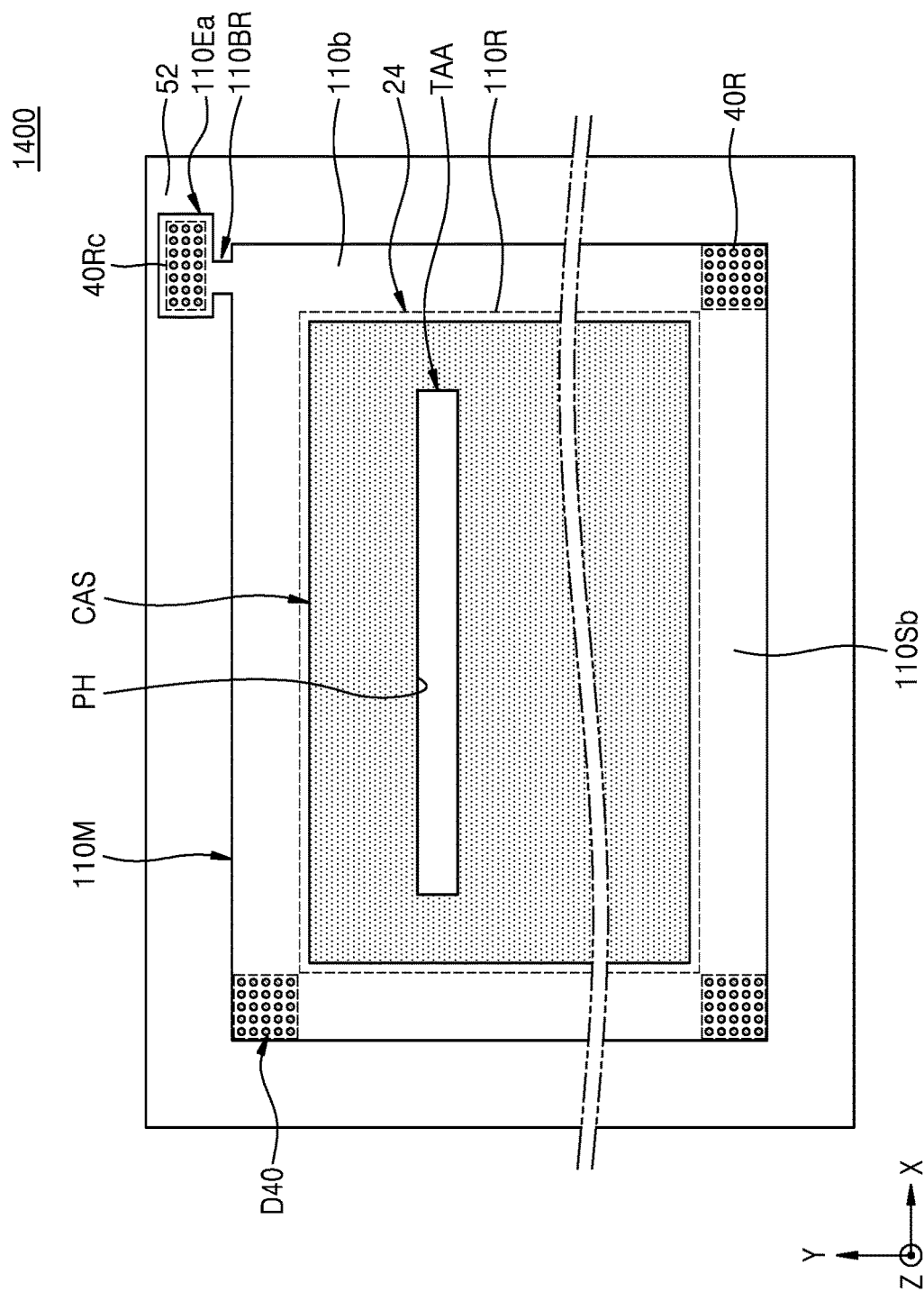
FIG. 8 is a schematic plan view illustrating a planar arrangement of some components of an IC device, according to example embodiments.

FIG. 8 is a schematic plan view illustrating a planar arrangement of some components of an IC device 1400, according to example embodiments. Referring to FIG. 8, the IC device 1400 may include a first diode region 40R and a second diode region 40Rc instead of the diode region 40R included the IC device 1100 shown in FIG. 5. A conductive plate 110b may further include an edge region 110Sb surrounding a tile region 110R. The conductive plate 110b may include a plate extension unit 110Ea and a plate connection unit 110BR. The plate extension unit 110Ea may be in an outer portion apart from at least one of four vertices of a plate main unit 110M having a rectangular planar shape. The plate connection unit 110BR may connect the plate main unit 110M to the plate extension unit 110Ea. In some embodiments, the plate extension unit 110Ea may have a rectangular planar shape. In some embodiments, the plate connection unit 110BR may have a bar-type planar shape.

The first diode region 40R and the second diode region 40Rc may be under the edge region 110Sb of the conductive plate 110b. The second diode region 40Rc may be under the plate extension unit 110Ea. The first diode region 40R may be under the edge region 110Sb adjacent to a vertex to which the plate connection unit 110BR configured to connect the plate main unit 110M to the plate extension unit 110Ea is not connected, from among the four vertices of the plate main unit 110M. The first diode region 40R may be substantially the same as the diode region 40R shown in FIG. 5. But, in some embodiments, the second diode region 40Rc may have a rectangular planar shape.

A plurality of antenna diodes D40 may be formed in each of the first diode region 40R and the second diode region 40Rc. FIG. 8 illustrates an example in which three first diode regions 40R and one second diode region 40Rc are under one conductive plate 110b in the IC device 1400, but the inventive concept is not limited thereto. The sum of the number of first diode regions 40R and the number of second diode regions 40Rc in the IC device 1400 may be four.

Figure 9:
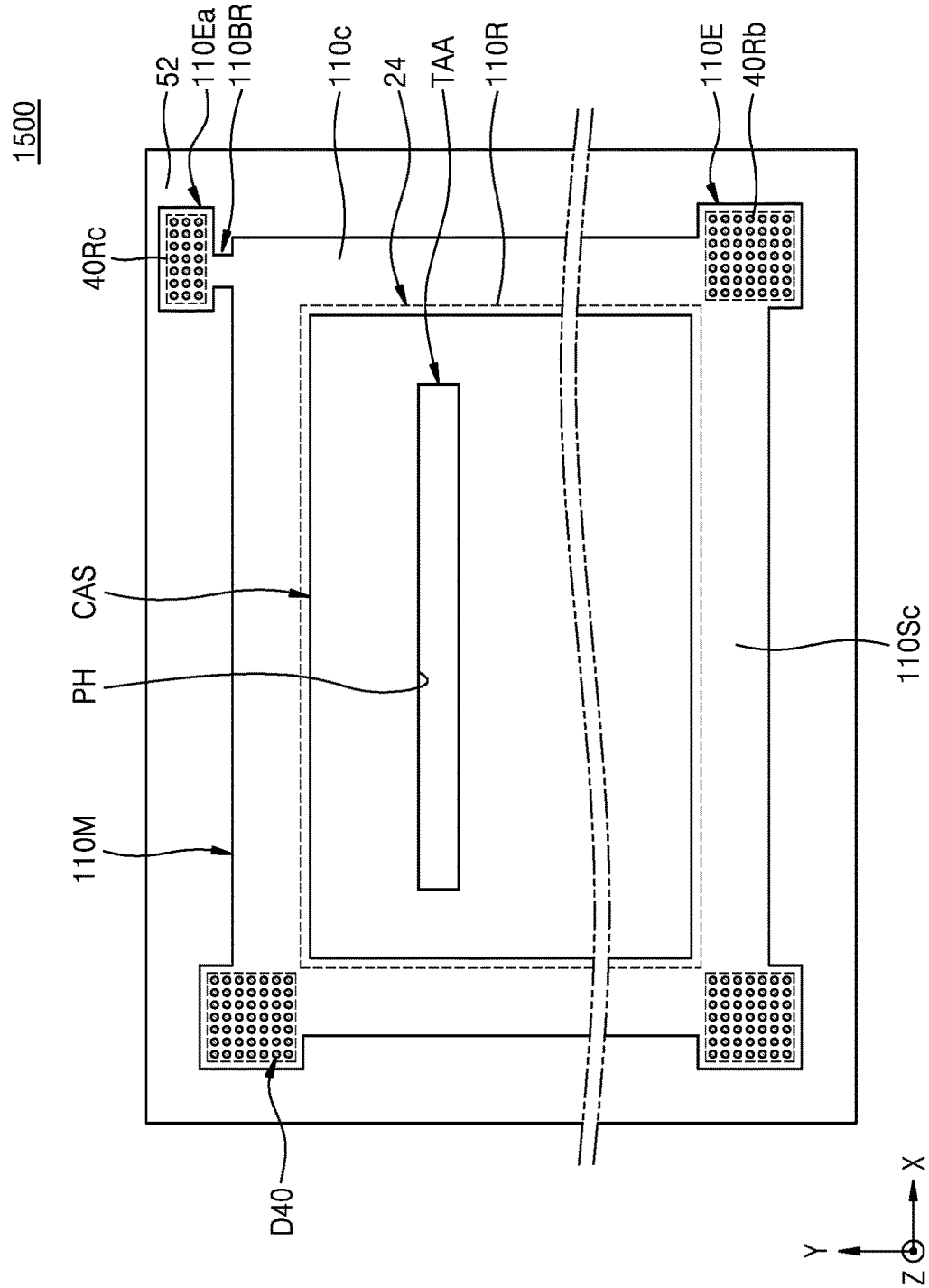
FIG. 9 is a schematic plan view illustrating a planar arrangement of some components of an IC device, according to example embodiments.

FIG. 9 is a schematic plan view illustrating a planar arrangement of some components of an IC device 1500, according to example embodiments. Referring to FIG. 9, the IC device 1500 may include a first diode region 40Rb and a second diode region 40Rc instead of the diode region 40R included in the IC device 1100 shown in FIG. 5. A conductive plate 110c may further include an edge region 110Sc surrounding a tile region 110R. The edge region 110Sc of the conductive plate 110c may include a first plate extension unit 110E, a second plate extension unit 110Ea, and a plate connection unit 110BR configured to connect a plate main unit 110M to the second plate extension unit 110Ea. The first plate extension unit 110E may be substantially the same as the plate extension unit 110E shown in FIG. 7, and the second plate extension unit 110Ea may be substantially the same as the plate extension unit 110Ea shown in FIG. 8. The first diode region 40Rb may be substantially the same as the diode region 40Rb shown in FIG. 7, and the second diode region 40Rc may be substantially the same as the diode region 40Rc shown in FIG. 8.

FIG. 9 illustrates an example in which three first diode regions 40Rb and one second diode region 40Rc are under one conductive plate 110c in the IC device 1500, but the inventive concept is not limited thereto. The sum of the number of first diode regions 40Rb and the number of second diode regions 40Rc in the IC device 1500 may be four.

Figure 10:
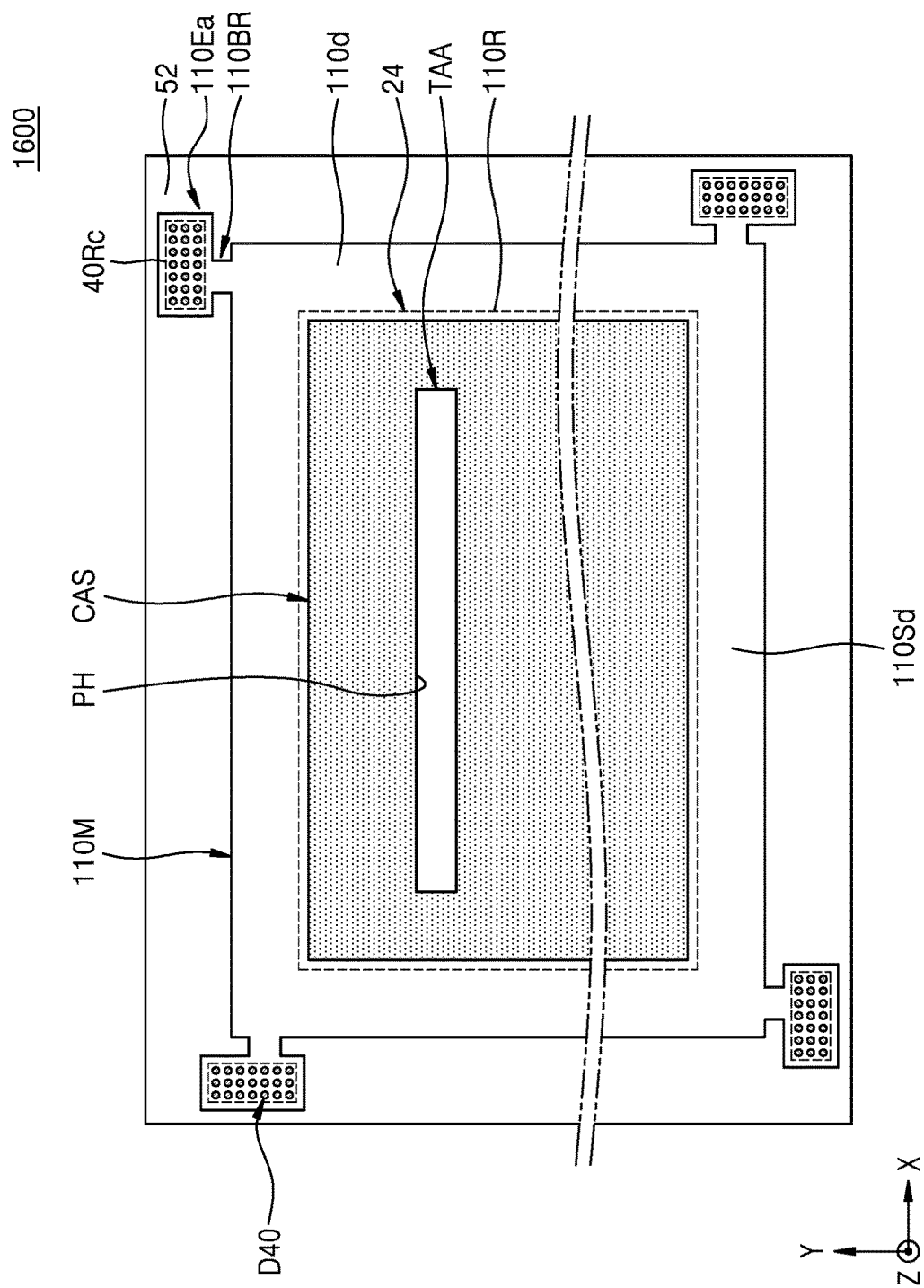
FIG. 10 is a schematic plan view illustrating a planar arrangement of some components of an IC device, according to example embodiments.

FIG. 10 is a schematic plan view illustrating a planar arrangement of some components of an IC device 1600, according to example embodiments.

Referring to FIG. 10, the IC device 1600 may include a diode region 40Rc instead of the diode region 40R included in the IC device 1100 shown in FIG. 5. An edge region 110Sd of a conductive plate 110d may include four plate extension units 110Ea and four plate connection units 110BR. The four plate extension units 110Ea may be respectively in outer portions apart from four vertices of a plate main unit 110M having a rectangular planar shape. The four plate connection units 110BR may connect the plate main unit 110M to the four plate extension units 110Ea.

The diode region 40Rc may be under the plate extension unit 110Ea. The diode region 40Rc may be substantially the same as the second diode region 40Rc shown in FIG. 8 or FIG. 9. In the IC device 1600, four diode regions 40Rc may be under one conductive plate 110d. That is, in the IC device 1600, the four diode regions 40Rc may be under four plate extension units 110Ea of one conductive plate 110d.

Figure 11:
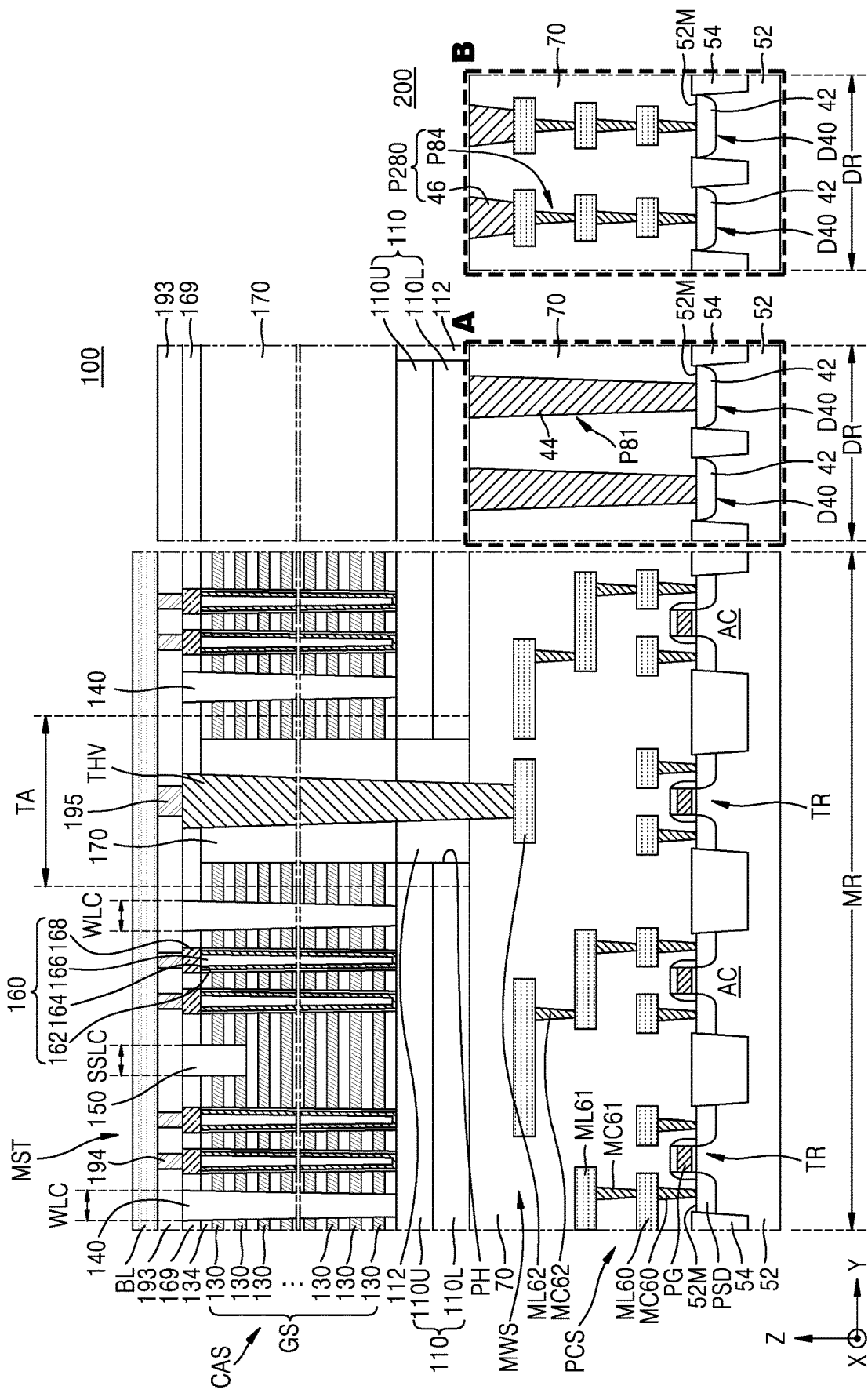
FIG. 11 is a cross-sectional view of IC devices according to example embodiments.

FIG. 11 is a cross-sectional view of IC devices 100 and 200 according to example embodiments. Referring to FIG. 11, the IC device 100 may include a memory cell region MR, and a diode region DR, which includes a plurality of antenna diodes as described herein. The memory cell region MR may be a portion in which a cell array structure CAS is vertically arranged (e.g., as a nonvolatile memory cell array). The diode region DR may be any one of the diode region 40R shown in FIG. 5, the diode region 40Ra shown in FIG. 6, the diode region 40Rb shown in FIG. 7, the first diode region 40R and the second diode region 40Rc shown in FIG. 8, the first diode region 40Rb and the second diode region 40Rc shown in FIG. 9, and the diode region 40Rc shown in FIG. 10.

The memory cell region MR may include a through electrode region TA. The through electrode region TA may have substantially the same configuration as the through electrode region TAA shown in FIGS. 5 to 10. A through hole PH may be formed in the through electrode region TA. In some embodiments, a plurality of through holes PH may be formed in the through electrode region TA. For example, in one through electrode region TA, some of the plurality of through holes PH may be linearly arranged along one straight line extending in a first lateral direction (X direction) and apart from each other, and the other through holes PH may be linearly arranged along another straight line, which is apart from the one straight line in a second lateral direction (Y direction), and apart from each other.

The IC device 100 may include a peripheral circuit structure PCS and the cell array structure CAS, which is on the peripheral circuit structure PCS and overlaps the peripheral circuit structure PCS in a vertical direction (Z direction). As shown, the peripheral circuit structure PCS may extend between the conductive plate 110 and the semiconductor substrate 52.

As shown by FIG. 11, the conductive plate 110 may extend between the peripheral circuit structure PCS and the cell array structure CAS, and may further function as the common source line CSL (see, e.g., FIGS. 1 and 3) for the CAS structure, which is electrically coupled to the antenna diodes. In some further embodiments, the conductive plate 110 may serve as a source region configured to supply current to vertical memory cells included in the cell array structure CAS.

In some embodiments, the conductive plate 110 may have a stack structure of a lower metal plate 110L and an upper semiconductor plate 110U. The metal plate 110L may include tungsten (W), and the semiconductor plate 110U may include doped polysilicon, without being limited thereto. In some other embodiments, the conductive plate 110 may omit the metal plate 110L and have a single layer structure including the semiconductor plate 110U.

The cell array structure CAS may include a memory stack MST of nonvolatile memory cells on the conductive plate 110. The memory stack MST may include a gate stack GS. The gate stack GS may include a plurality of gate lines 130, which extend parallel to each other in a lateral direction and overlap each other in the vertical direction (Z direction). An insulating film 134 may be between the conductive plate 110 and the plurality of gate lines 130 and between the plurality of gate lines 130.

On the conductive plate 110, a plurality of word line cut regions WLC may intersect with the memory stack MST and extend lengthwise in the first lateral direction (X direction). Widths of the plurality of gate lines 130 in the second lateral direction (Y direction) may be defined by the plurality of word line cut regions WLC, respectively. Each of the plurality of word line cut regions WLC may be filled with an insulating film 140, which may contact the conductive plate 110, as shown. The plurality of gate lines 130 included in one gate stack GS may be stacked and overlap each other in the vertical direction (Z direction) between two adjacent word line cut regions WLC on the conductive plate 110. The plurality of gate lines 130 included in one gate stack GS may constitute the ground selection line GSL, the plurality of word lines WL, and the string selection line SSL, which have been described with reference to FIG. 3. From among the plurality of gate lines 130, two gate lines 130 at an upper side may be separated from each other with a string selection line cut region SSLC therebetween in the second lateral direction (Y direction). Two gate lines 130, which are separated from each other with the string selection line cut region SSLC therebetween, may respectively constitute the string selection lines SSL described with reference to FIG. 3. The string selection line cut region SSLC may be filled by an insulating film 150.

A plurality of channel structures 160 may pass through the plurality of gate lines 130 and extend in the vertical direction (Z direction) on the conductive plate 110. The plurality of channel structures 160 may be arranged a predetermined distance apart from each other in the first lateral direction (X direction) and the second lateral direction (Y direction). Each of the plurality of channel structures 160 may include a gate dielectric film 162, a channel region 164, a buried insulating film 166, and a drain region 168. The gate dielectric film 162 may include a tunneling dielectric film, a charge storage film, and a blocking dielectric film, which are sequentially formed in the channel region 164. The channel region 164 may have a cylindrical shape. An inner space of the channel region 164 may be filled with the buried insulating film 166. A plurality of drain regions 168 may be insulated from each other by a cover insulating film 169.

A plurality of bit lines BL may be on the plurality of channel structures 160. One of the plurality of bit lines BL is illustrated in FIG. 11. For example, the plurality of bit lines BL may extend long in the second lateral direction (Y direction) parallel to each other on the cell array structure CAS. The bit line BL may be apart from the conductive plate 110 with the cell array structure CAS therebetween. The plurality of channel structures 160 may be covered by an inter-wiring insulating film 193. Each of the plurality of channel structures 160 may be connected to a corresponding one of the bit lines BL through one of a plurality of contact pads 194 passing through the inter-wiring insulating film 193.

Each of the plurality of through holes PH formed in the through electrode region TA of the conductive plate 110 may be filled with a buried insulating film 112. A filling insulating film 170 may be on the buried insulating film 112. The filling insulating film 170 may pass through the plurality of gate lines 130 and a plurality of insulating films 134 and extend in the vertical direction (Z direction). In the through electrode region TA, a through electrode THV may pass through the gate line 130 of the cell array structure CAS and extend in the vertical direction (Z direction). The through electrode THV may be electrically connected to a corresponding one of the bit lines BL and a structure within the underlying peripheral circuit structure PCS. The through electrode THV may pass through the conductive plate 110 via the through hole PH and extend long into the peripheral circuit structure PCS in the vertical direction (Z direction).

The peripheral circuit structure PCS may include a lower substrate 52, a plurality of peripheral circuits formed on a main surface 52M of the lower substrate 52, and a multi-layered wiring structure MWS. Each of a plurality of through electrodes THV may be connected to at least one selected from the plurality of peripheral circuits through the multilayered wiring structure MWS included in the peripheral circuit structure PCS. The plurality of peripheral circuits included in the peripheral circuit structure PCS may include various circuits included in the peripheral circuit 30 described with reference to FIG. 1. In some embodiments, the plurality of peripheral circuits included in the peripheral circuit structure PCS may include the row decoder 32, the page buffer 34, the data I/O circuit 36, the control logic 38, and the CSL driver 39, which are shown in FIG. 1. The plurality of through electrodes THV may be connected to a page buffer (refer to 34 in FIG. 1) of the plurality of peripheral circuits included in the peripheral circuit structure PCS.

The lower substrate 52 may include a semiconductor substrate. For example, the lower substrate 52 may include silicon (Si), germanium (Ge), or silicon germanium (SiGe). An active region AC may be defined by a device isolation film 54 in the lower substrate 52. A plurality of transistors TR may be formed on the active region AC and constitute the plurality of peripheral circuits. Each of the plurality of transistors TR may include a gate PG and a plurality of ion implantation regions PSD formed in the active region AC on both sides of the gate PG. Each of the plurality of ion implantation regions PSD may constitute a source region or a drain region of the transistor TR. At least one of the plurality of transistors TR may constitute the CSL driver (refer to 39 in FIG. 1).

The multilayered wiring structure MWS may include a plurality of peripheral circuit wiring layers (e.g., ML60, ML61, and ML62) and a plurality of peripheral circuit contacts (e.g., MC60, MC61, and MC62), which are connected to the plurality of peripheral circuits included in the peripheral circuit structure PCS. A least some of the peripheral circuit wiring layers ML60, ML61, and ML62 may be connected to the transistor TR. The peripheral circuit contacts MC60, MC61, and MC62 may connect the plurality of transistors TR to some selected from the peripheral circuit wiring layers ML60, ML61, and ML62. A lower surface of the through electrode THV may be connected to one of the peripheral circuit wiring layers ML60, ML61, and ML62. For example, the lower surface of the through electrode THV may be connected to the peripheral circuit wiring layer ML62, which is an uppermost layer of the plurality of peripheral circuit wiring layers ML60, ML61, and ML62, which is closest to the cell array structure CAS. Although FIG. 11 illustrates an example in which the multilayered wiring structure MWS has three wiring layers in the vertical direction (Z direction), the inventive concept is not limited thereto. In some embodiments, the peripheral circuit wiring layers ML60, ML61, and ML62 may have respectively different thicknesses in a vertical direction (Z direction).

The peripheral circuit structure PCS may further include a plurality of antenna diodes D40 formed in the lower substrate 52 in the diode region DR. Anode terminals of the plurality of antenna diodes D40 may be electrically connected to the conductive plate 110 by a plurality of bypass wiring structures P81, so that an electrically conductive path (e.g., to remove charges accumulated on the conductive plate) is provided to the substrate 52 during fabrication. In some embodiments, in the diode region DR, the conductive plate 110 may be sequentially covered by the filling insulating film 170, the cover insulating film 169, and the inter-wiring insulating film 193.

The antenna diode D40 may include a diode ion implantation region 42 (e.g., anode region). In some embodiments, the active region AC of the lower substrate 52 may include a first conductive type ion implantation region, and the diode ion implantation region 42 may include a second conductive type ion implantation region (e.g., anode region), which has a different conductive type from the first conductive type ion implantation region. The second conductive type ion implantation region and the first conductive type ion implantation region may form a P-N junction diode. In some embodiments, the diode ion implantation region 42 may have the same conductive type as the ion implantation region PSD of the transistor TR included in the CSL driver (refer to 39 in FIG. 1).

The plurality of bypass wiring structures P81 may connect one of the edge regions 110S, 110Sa, 100Sb, and 110Sc described with reference to FIGS. 5 to 10 to the diode ion implantation regions 42 included in the plurality of antenna diodes D40. The bypass wiring structure P81 may include a bypass via contact 44 having an upper surface in contact with a lower surface of the conductive plate 110 and a lower surface in contact with the diode ion implantation region 42 of the antenna diode D40. The upper surface of the bypass via contact 44 may be in contact with a lower surface of one of the edge regions 110S, 110Sa, 100Sb, and 110Sc described with reference to FIGS. 5 to 10.

In some embodiments, the bypass wiring structure P81 and the antenna diode D40 may bypass unwanted charges capable of generating a large current due to arcing to the lower substrate 52 to thereby prevent the charges from being accumulated in the conductive plate 110. Accordingly, by avoiding arcing caused by the accumulation of undesired charges in the conductive plate 110, the degradation of a plurality of peripheral circuits (e.g., the CSL driver 39 in FIG. 1) including the plurality of transistors TR formed in the peripheral circuit structure PCS may be prevented.

Each of the bypass via contact 44, the plurality of peripheral circuit wiring layers ML60, ML61, and ML62, and the plurality of peripheral circuit contacts MC60, MC61, and MC62 may include a metal, a conductive metal nitride, a metal silicide, or a combination thereof. The plurality of transistors TR, the bypass via contact 44, and the multilayered wiring structure MWS, which are included in the peripheral circuit structure PCS, may be covered by an interlayer insulating film 70. The plurality of through electrodes THV may pass through a portion of the interlayer insulating film 70 and be in contact with an upper surface of the peripheral circuit wiring layer ML62. The interlayer insulating film 70 may include silicon oxide, silicon oxynitride (SiON), and/or silicon oxycarbonitride (SiOCN).

The IC device 100 according to the present embodiment may be one of the IC device 1100 shown in FIG. 5, the IC device 1200 shown in FIG. 6, the IC device 1300 shown in FIG. 7, the IC device 1400 shown in FIG. 8, the IC device 1500 shown in FIG. 9, and the IC device 1600 shown in FIG. 10. Also, the diode region DR included in the IC device 100 according to the present embodiment may be one of the diode region 40R included in the IC device 1100 shown in FIG. 5, the diode region 40Ra included in the IC device 1200 shown in FIG. 6, the diode region 40Rb included in the IC device 1300 shown in FIG. 7, the first and second diode regions 40R and 40Rc included in the IC device 1400 shown in FIG. 8, the first and second diode regions 40Rb and 40Rc included in the IC device 1500 shown in FIG. 9, and the diode region 40Rc included in the IC device 1600 shown in FIG. 10. That is, the diode region DR may be in portions of the peripheral circuit structure PCS, which are adjacent to all four vertices of the tile region (refer to 110R in FIGS. 5 to 10) located at a position corresponding to the tile (refer to 24 in FIGS. 5 to 10) included in the IC device 100.

A plurality of IC devices 100 may be simultaneously formed on a semiconductor wafer including the lower substrate 52. A partial die (refer PD in FIG. 18), which is a structure corresponding to a portion of the IC device 100, may be formed in an edge portion of the semiconductor wafer. The partial die PD may include a plate piece corresponding to a portion of the conductive plate 110. If sufficient undesired charges are accumulated in a conductive plate, any large current caused by arcing in response to the accumulation of charges may deteriorate the plurality of peripheral circuits including the plurality of transistors TR formed in the peripheral circuit structure PCS of the IC device 100 adjacent to the partial die PD.

Fortunately, the diode region DR, in which the antenna diode D40 is under each of portions adjacent to the four vertices of the tile region (refer to 110R in FIGS. 5 to 10), may be formed in the IC device 100 according to the present embodiment. Accordingly, at least a portion of the diode region DR in which the antenna diode D40 is arranged may be formed also in the partial die PD formed in the edge portion of the semiconductor wafer. Thus, charges capable of generating a large current due to arcing may be bypassed to the lower substrate 52 through the antenna diode D40 to prevent the unwanted and possibly catastrophic accumulation of charges.

The IC device 200 may have substantially the same configuration as the IC device 100 except that the IC device 200 has portion B instead of portion A. However, the IC device 200 may include a bypass wiring structure P280 instead of the bypass wiring structure P81. The bypass wiring structure P280 may include a bypass via contact 46 and a middle wiring structure P84. The bypass via contact 46 may have an upper surface in contact with the lower surface of the conductive plate 110 and a lower surface, which is apart from the diode ion implantation region 42 of the antenna diode D40 in the vertical direction (Z direction). The middle wiring structure P84 may be connected between the bypass via contact 46 and the diode ion implantation region 42. The upper surface of the bypass via contact 46 may be in contact with the lower surface of one of the edge regions 110S, 110Sa, 100Sb, and 110Sc described with reference to FIGS. 5 to 10.

The middle wiring structure P84 may be a portion of the multilayered wiring structure MWS. The middle wiring structure P84 may have a multilayered wiring structure. FIG. 11 illustrates an example in which the middle wiring structure P84 includes the peripheral circuit wiring layers ML60, ML61, and ML62 formed at different vertical levels and the peripheral circuit contacts MC60, MC61, and MC62 configured to connect some of the peripheral circuit wiring layers ML60, ML61, and ML62 to each other, and an uppermost wiring layer of the middle wiring structure P84 is the peripheral circuit wiring layer ML62. However, the inventive concept is not limited thereto. For example, the uppermost wiring layer of the middle wiring structure P84 may be the peripheral circuit wiring layer ML60 or the peripheral circuit wiring layer ML61. An upper surface of the uppermost wiring layer of the middle wiring structure P84 may be in contact with the lower surface of the bypass via contact 46. The peripheral circuit contact MC60, which is at a lowermost portion of the middle wiring structure P84, may be in contact with the diode ion implantation region 42. In some embodiments, the bypass wiring structure P280 including the bypass via contact 46 and the middle wiring structure P84 and the antenna diode D40 may bypass charges capable of generating a large current due to arcing to the lower substrate 52 to prevent the charges from being accumulated in the conductive plate 110.

Figure 12:
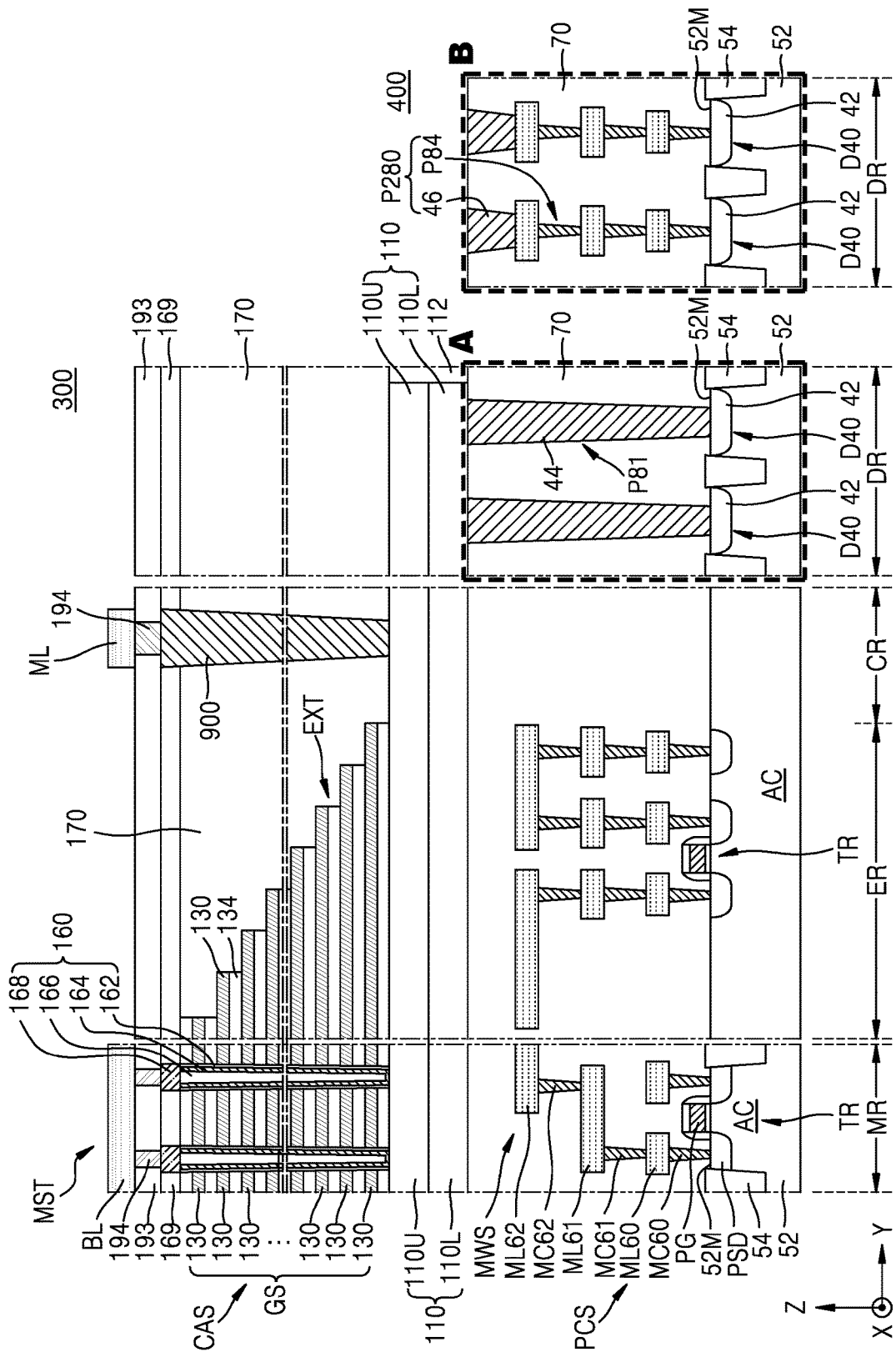
FIG. 12 is a cross-sectional view of IC devices according to example embodiments.

FIG. 12 is a cross-sectional view of IC devices 300 and 400 according to example embodiments. Referring to FIG. 12, the IC device 300 may include a memory cell region MR, a connection region ER, a contact region CR, and a diode region DR. In the IC device 300, the memory cell region MR and the diode region DR may have substantially the same configurations as the memory cell region MR and the diode region DR of the IC device 100 described with reference to FIG. 11.

In the connection region ER, a filling insulating film 170 may cover extensions EXT of a plurality of gate lines 130 on a conductive plate 110. An upper surface of the filling insulating film 170 may be sequentially covered by a cover insulating film 169 and an inter-wiring insulating film 193. Edge portions of the extensions EXT of the plurality of gate lines 130 may form a staircase structure.

A plate contact 900 having a lower surface in contact with the conductive plate 110 may be in the contact region CR. The plate contact 900 may pass through the cover insulating film 169 and the filling insulating film 170 and be connected to an upper surface of the conductive plate 110. The plate contact 900 may electrically connect a wiring pattern ML to the conductive plate 110. A plate contact 920 may be connected to the wiring pattern ML through one contact pad 194 of a plurality of contact pads 194. The wiring pattern ML may be at the same vertical level as the bit line BL. In some embodiments, the wiring pattern ML may include the same material as the bit line BL. For example, each of the wiring pattern ML and the bit line BL may be formed by patterning a single wiring material layer. For example, the wiring pattern ML may be a portion of the bit line BL.

In some embodiments, to prevent undesired charges from being accumulated in the wiring material layer during a process of forming the wiring pattern ML and the bit line BL, the plate contact 900 may transmit charges to the conductive plate 110 and bypass the charges to a lower substrate 52 through a bypass wiring structure P81 and an antenna diode D40.

The IC device 400 may have substantially the same configuration as the IC device 300 except that the IC device 400 has portion B instead of portion A of the IC device 300. However, the IC device 400 may include a bypass wiring structure P280 instead of the bypass wiring structure P81. The bypass wiring structure P280 may include a bypass via contact 46 having an upper surface in contact with a lower surface of the conductive plate 110 and a middle wiring structure P84 connected between the bypass via contact 46 and a diode ion implantation region 42.

In some embodiments, to prevent undesired charges from being accumulated in the wiring material layer during the process of forming the wiring pattern ML and the bit line BL, the plate contact 900 may transmit charges to the conductive plate 110 and bypass the charges to the lower substrate 52 through the bypass wiring structure P280 including the bypass via contact 46 and the middle wiring structure P84 and the forward-biased antenna diode D40.

Figure 13:
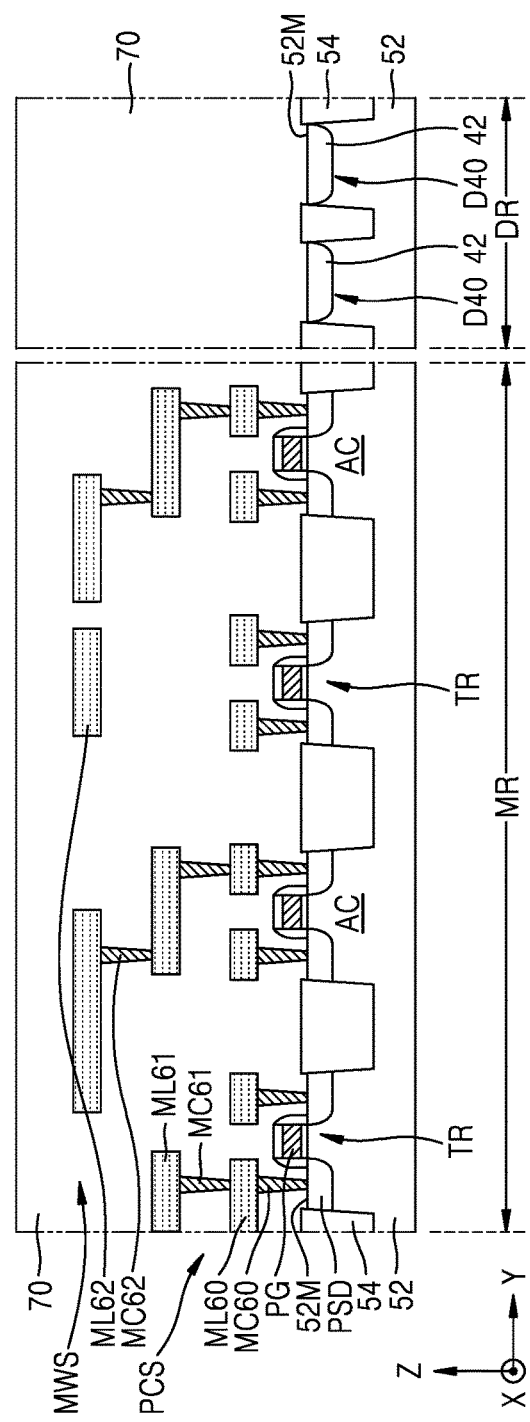
FIGS. 13 to 17 are cross-sectional views of a process sequence of a method of manufacturing an IC device, according to example embodiments.

FIGS. 13 to 17 are cross-sectional views of a process sequence of a method of manufacturing an IC device 100, according to example embodiments. The method of manufacturing the IC device 100 shown in FIG. 11, according to the example embodiment, will be described with reference to FIGS. 13 to 17. Referring to FIG. 13, a peripheral circuit structure PCS including a lower substrate 52, a plurality of transistors TR, a multilayered wiring structure MWS, and an interlayer insulating film 70 may be formed. The peripheral circuit structure PCS may include a diode ion implantation region 42 of a common antenna diode D40 formed in a diode region DR.

Figure 14:
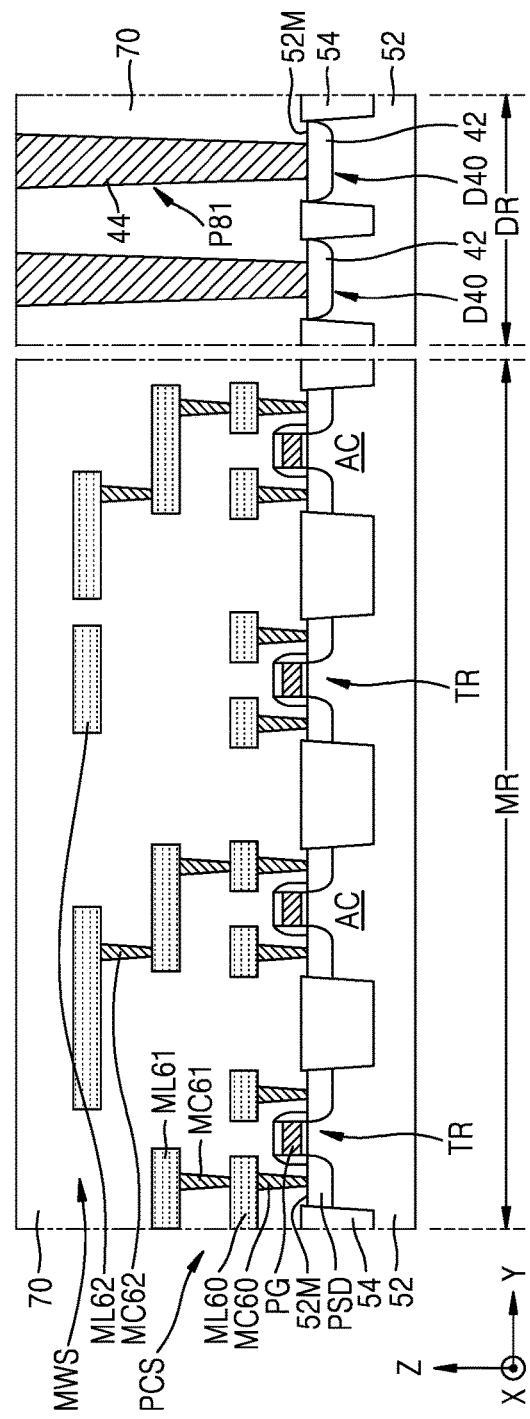

Referring to FIG. 14, a bypass via contact 44 may be formed in the diode region DR. The bypass via contact 44 may pass through the interlayer insulating film 70 and extend to the diode ion implantation region 42 of the antenna diode D40. The bypass via contact 44 may constitute a bypass wiring structure P81.

Figure 15:
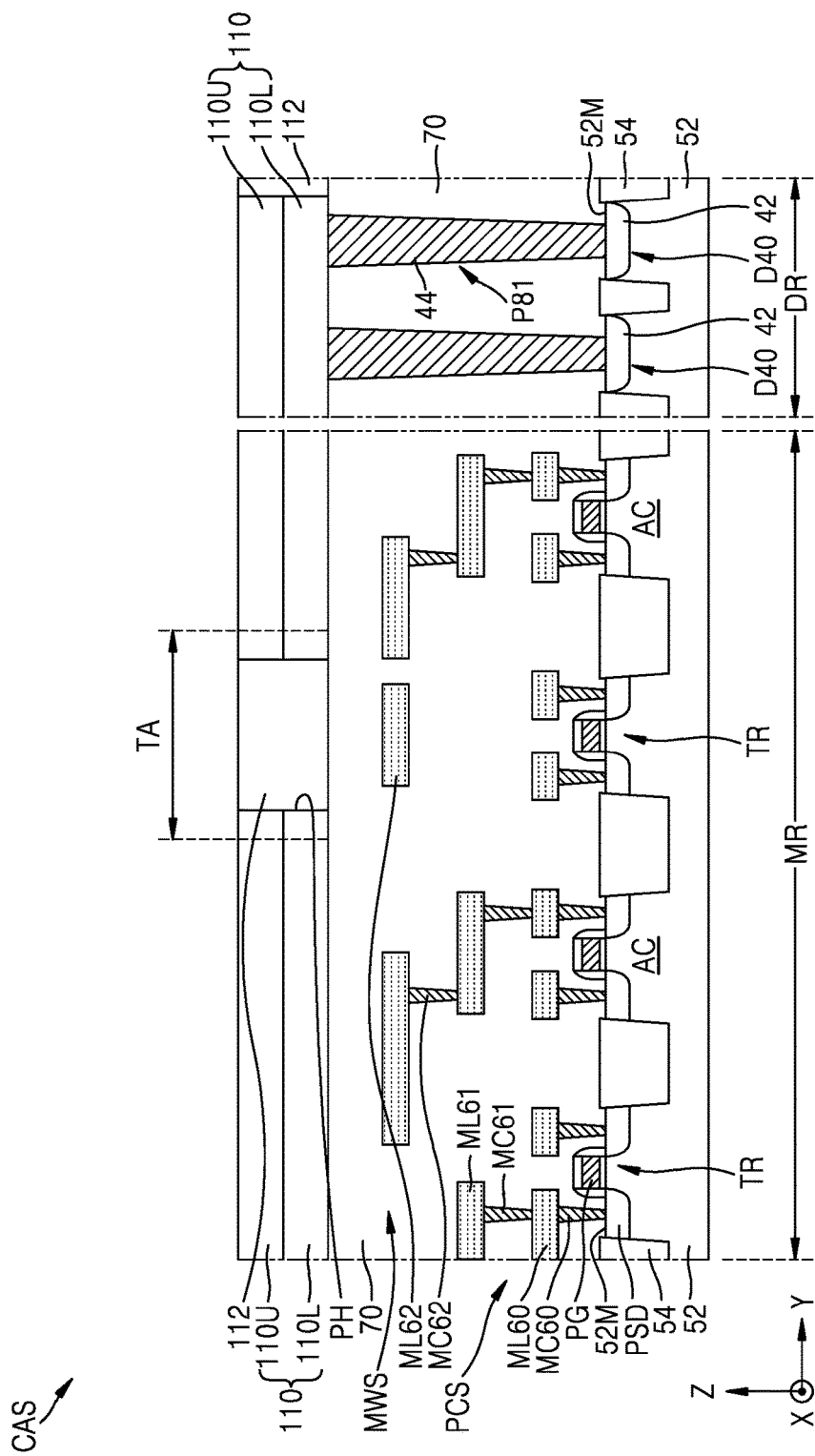

Referring to FIG. 15, a conductive plate 110 may be formed on the peripheral circuit structure PCS and the bypass via contact 44, a through hole PH may be formed in a through electrode region TA of the conductive plate 110, and a buried insulating film 112 may be formed to fill the through hole PH. In some embodiments, the conductive plate 110 may be formed to have a horizontal width and a horizontal area less than those of the lower substrate 52. The buried insulating film 112 may fill spaces around edges of the conductive plate 110. In some embodiments, the conductive plate 110 may be formed by sequentially forming a metal plate 110L and a semiconductor plate 110U. In some other embodiments, the conductive plate 110 may not include the metal plate 110L but include only the semiconductor plate 110U.

Figure 16:
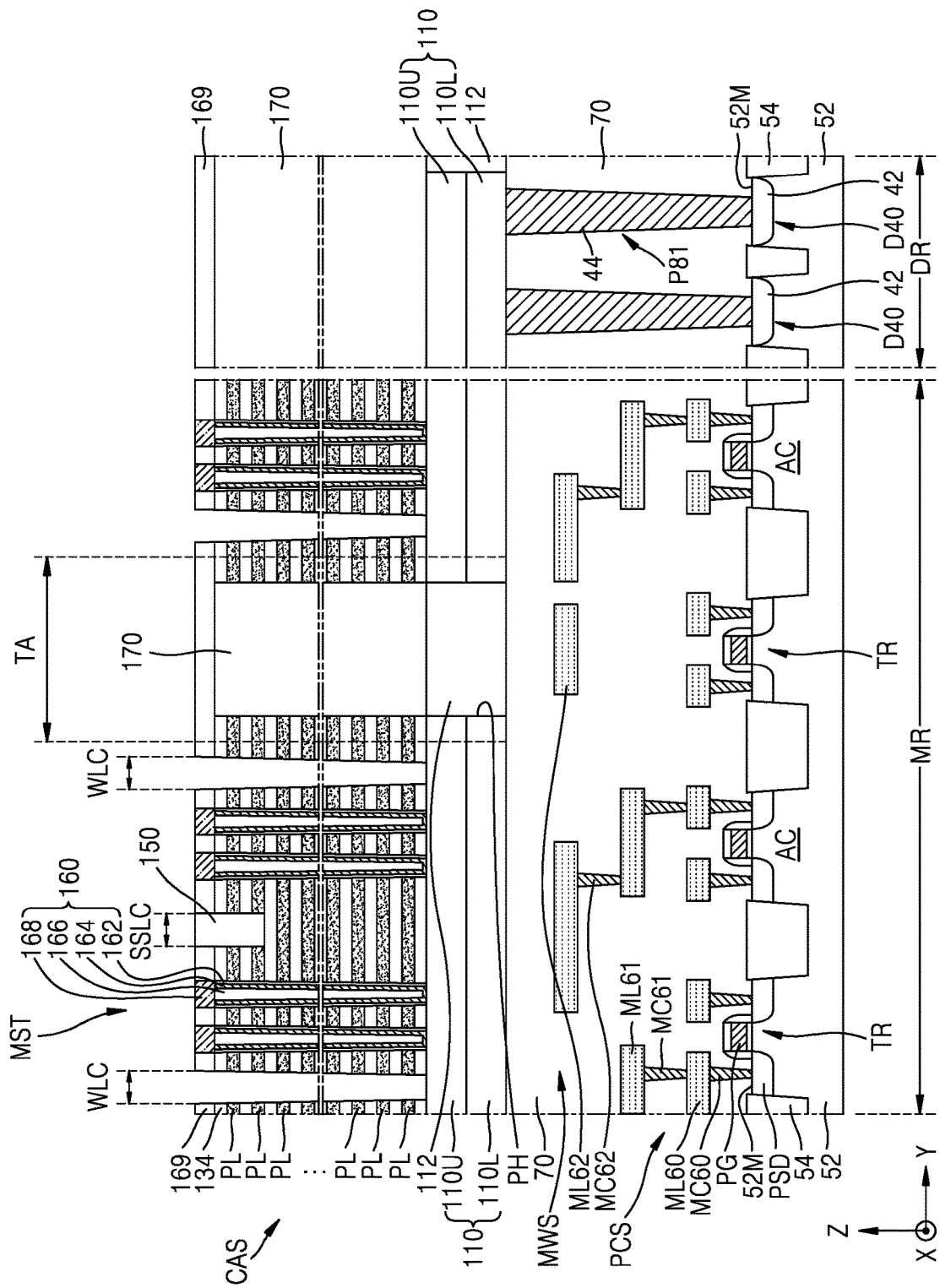

Referring to FIG. 16, a plurality of insulating films 134 and a plurality of sacrificial films PL may be alternately stacked one by one on the conductive plate 110 and the buried insulating film 112. The plurality of sacrificial films PL may include silicon nitride, silicon carbide, or polysilicon. The plurality of sacrificial films PL may obtain spaces for forming a plurality of gate lines (refer to 130 in FIG. 17) in a subsequent process.

A portion of each of the plurality of insulating films 134 and the plurality of sacrificial films PL may be removed, the removed portion of each of the plurality of insulating films 134 and the plurality of sacrificial films PL may be filled with a filling insulating film 170, and a cover insulating film 169 may be formed. The cover insulating film 169 may be formed to cover the insulating film 134, which is an uppermost layer of the plurality of insulating films 134, and the filling insulating film 170. Thereafter, a plurality of channel structures 160 may be formed to pass through the cover insulating film 169, the plurality of insulating films 134, and the plurality of sacrificial films PL, and a string selection line cut region SSLC may be formed and filled with an insulating film 150.

Thereafter, a plurality of word line cut regions WLC may be formed to pass through the cover insulating film 169, the plurality of insulating films 134, and the plurality of sacrificial films PL. An upper surface of the conductive plate 110 may be exposed by the plurality of word line cut regions WLC (see also, FIG. 11).

Figure 17:
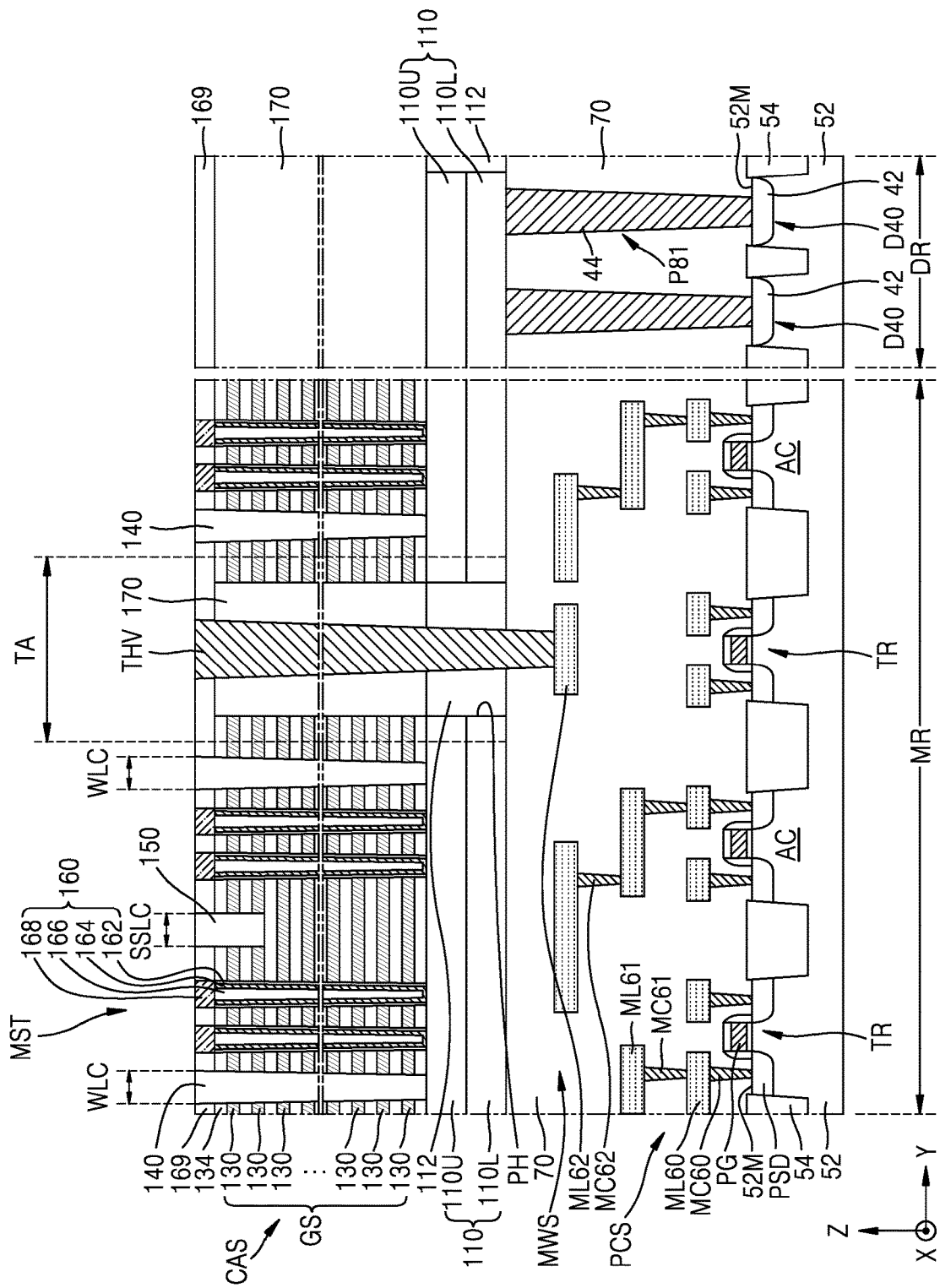

Referring to FIGS. 16 and 17, the plurality of sacrificial films PL may be replaced by the plurality of gate lines 130 due to the plurality of word line cut regions WLC. In some embodiments, to replace the plurality of sacrificial films PL by the plurality of gate lines 130, the plurality of sacrificial films PL exposed by the plurality of word line cut regions WLC may be selectively removed to provide vacant spaces between the plurality of insulating films 134. The vacant spaces may be filled with a conductive material to form the plurality of gate lines 130. Afterwards, an insulating film 140 may be formed to fill the plurality of word line cut regions WLC.

A through electrode THV may be formed to pass through the cover insulating film 169, the filling insulating film 170, the buried insulating film 112, and the interlayer insulating film 70 and be in contact with an upper surface of a peripheral circuit wiring layer ML62. In some embodiments, the peripheral circuit wiring layer ML62, which is in contact with the through electrode THV, may be connected to the page buffer (refer to 34 in FIG. 1) of the plurality of peripheral circuits formed in the peripheral circuit structure PCS.

Afterwards, as shown in FIG. 11, an inter-wiring insulating film 193 may be formed to cover an upper surface of the resultant structure including a plurality of through electrodes THV, and a plurality of contact pads 194 and a contact pad 195 may be formed to pass through the inter-wiring insulating film 193. The plurality of contact pads 194 may be respectively connected to drain regions 168 of the plurality of channel structures 160, and the contact pad 195 may be connected to the through electrode THV. Thereafter, a bit line BL may be formed on the plurality of contact pads 194 and the contact pad 195, thereby completing the manufacture of the IC device 100 shown in FIG. 11. The bit line BL may be connected to the plurality of channel structures 160 and the through electrode THV through the plurality of contact pads 194 and the contact pad 195.

Although the method of manufacturing the IC device 100 shown in FIG. 11 has been described with reference to FIGS. 13 to 17, it will be understood that the IC device 200 shown in FIG. 11, the IC devices 300 and 400 shown in FIG. 12, and various IC devices having similar structures thereto may be manufactured by making various modifications and changes with reference to the descriptions of FIGS. 13 to 17 within the scope of the inventive concept.

For example, the formation of the IC device 200 shown in FIG. 11 and the IC device 400 shown in FIG. 12 may include forming a middle wiring structure P84 during the process of forming the multilayered wiring structure MWS and forming a bypass via contact 46 instead of forming the bypass via contact 44 shown in FIG. 14. Moreover, the formation of the IC devices 300 and 400 shown in FIG. 12 may include forming a plate contact 900 during the process of forming the through electrode THV. The plate contact 900 may pass through the cover insulating film 169 and the filling insulating film 170 and be in contact with the upper surface of the conductive plate 110.

Figure 18:
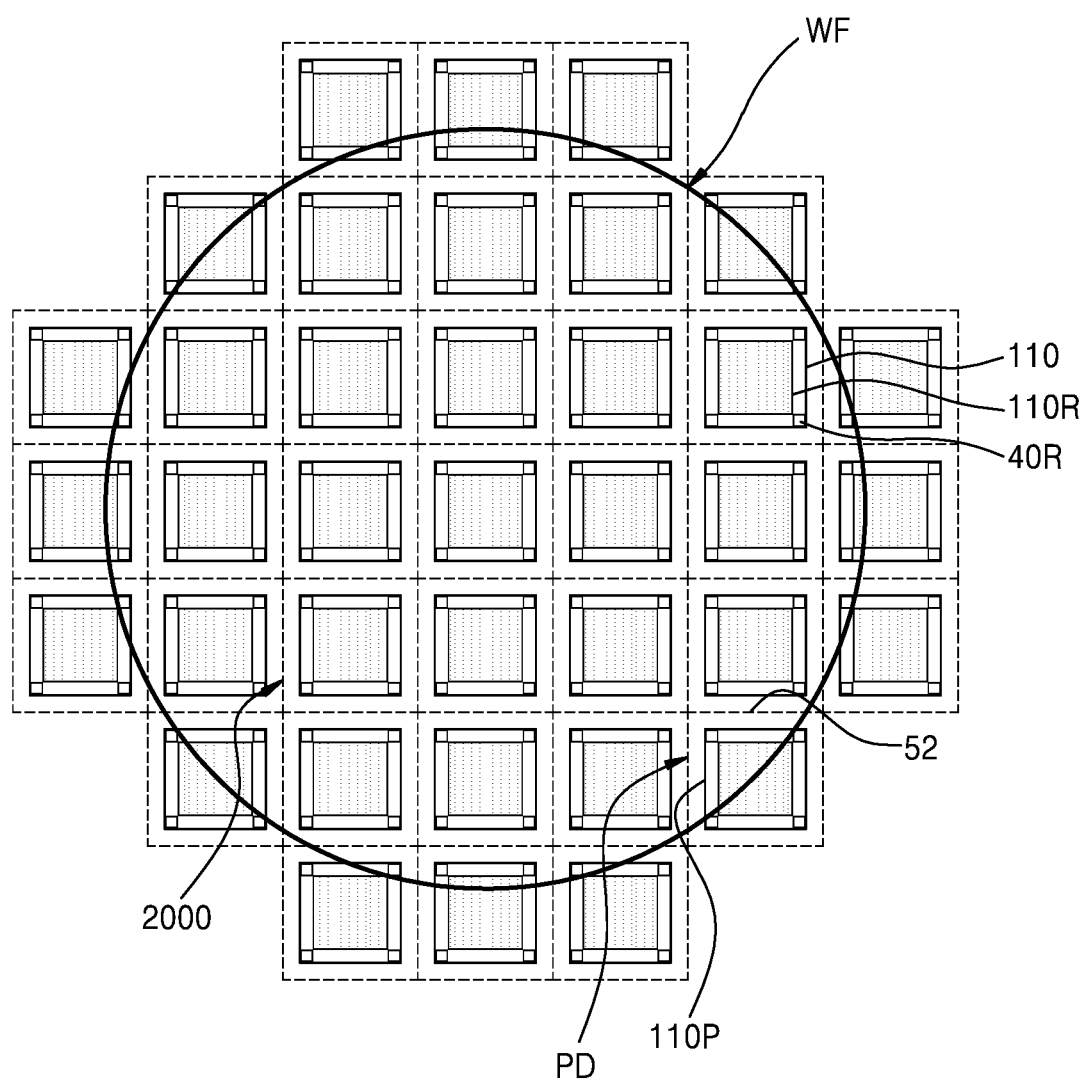
FIG. 18 is a conceptual diagram of a method of manufacturing an IC device, according to example embodiments.

FIG. 18 is a conceptual diagram of a method of manufacturing IC devices, according to example embodiments. Referring to FIG. 18, a plurality of IC devices 2000 may be simultaneously formed on a semiconductor wafer WF including a lower substrate 52. Each of the IC devices 2000 may include any one of the IC devices 10, 100, 200, 300, 400, 500, 1000, 1100, 1200, 1300, 1400, 1500, and 1600, which have been described with reference to FIGS. 1 to 17.

A partial die PD, which is a structure corresponding to a portion of the IC device 2000, may be formed in an edge portion of the semiconductor wafer WF. The partial die PD may include a plate piece 110P corresponding to a portion of a conductive plate 110. When undesired charges are accumulated in the plate piece 110P, a large "arching" current may be generated and may severely deteriorate a plurality of peripheral circuits including a plurality of transistors formed in a peripheral circuit structure of the IC device 2000 adjacent to the partial die PD.

However, a preferred diode region DR may be formed in the IC device 200 according to the present embodiment. In the diode region DR, antenna diodes D40 may be respectively formed under portions of the conductive plate 110, which are adjacent to four vertices of a tile region 110R. Accordingly, at least a portion of the diode region DR in which the antenna diodes D40 are arranged may be formed also in the partial die PD formed in the edge portion of the semiconductor wafer WF. Thus, charges capable of generating a large current due to arcing may be bypassed to the lower substrate 52 through the forward-biased antenna diode D40 to prevent the charges from being accumulated in the plate piece 110P. As a result, the plurality of peripheral circuits included in the IC device 2000 may be protected.

Figure 19:
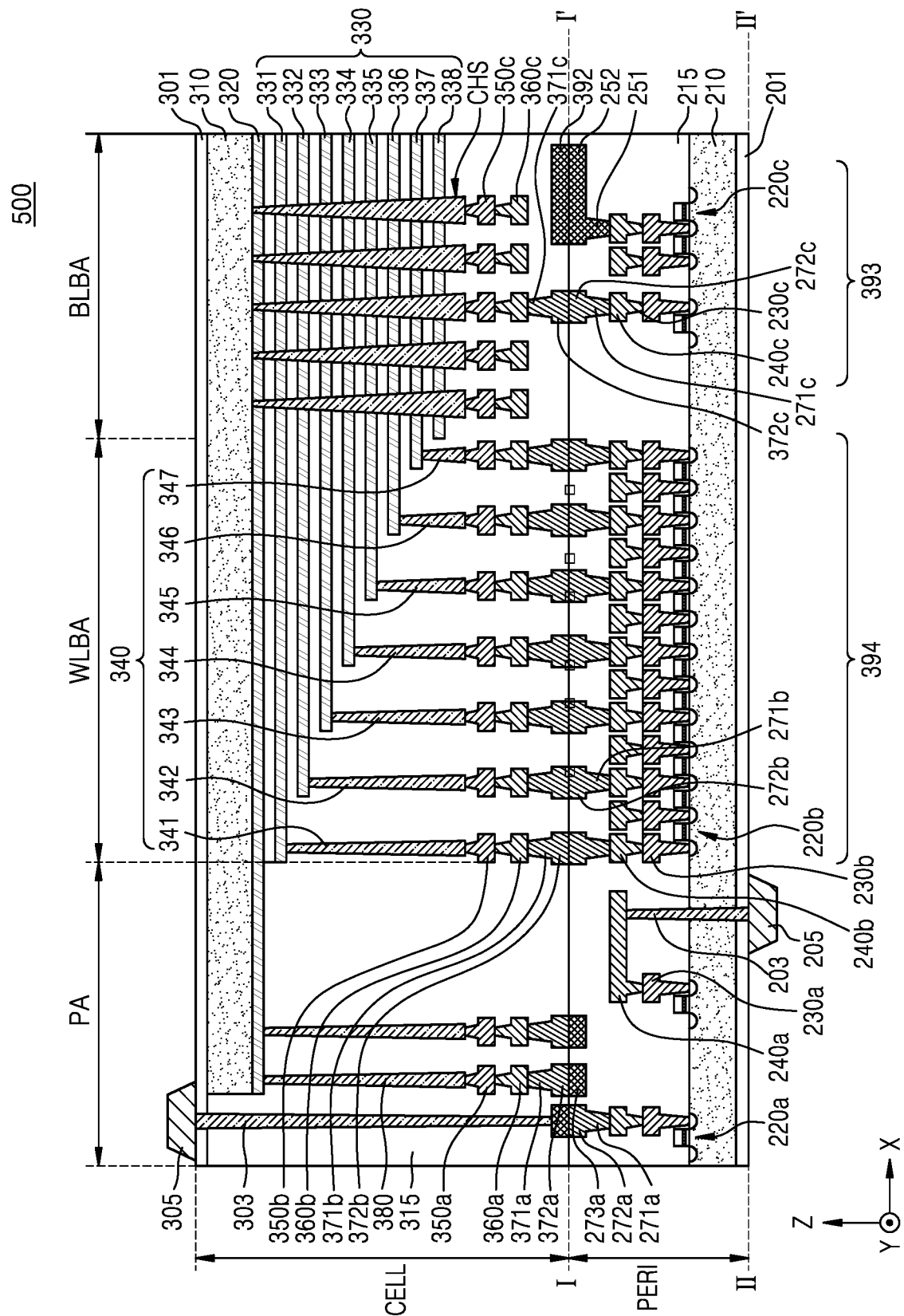
FIG. 19 is a cross-sectional view of an IC device according to example embodiments.

FIG. 19 is a diagram illustrating a memory device 500 according to another example embodiment. Referring to FIG. 19, a memory device 500 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W). The IC device 500 may further include a diode region 40R, 40Ra, 40Rb, or 40Rc. A plurality of antenna diodes D40, which are substantially the same as described with reference to FIGS. 1 to 17, may be arranged in portions of the diode region 40R, 40Ra, 40Rb, or 40Rc, which are adjacent to an edge of a first substrate 210.

Each of the peripheral circuit region PERI and the cell region CELL of the memory device 500 may include an external pad bonding area PA, a word line bonding area WLBA, and a bit line bonding area BLBA. The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrate in FIG. 19, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240*a*, 240*b*, and 240*c*.

The interlayer insulating layer 215 may be disposed on the first substrate 210 and cover the plurality of circuit elements 220*a*, 220*b*, and 220*c*, the first metal layers 230*a*, 230*b*, and 230*c*, and the second metal layers 240*a*, 240*b*, and 240*c*. The interlayer insulating layer 215 may include an insulating material such as silicon oxide, silicon nitride, or the like.

Lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically bonded to upper bonding metals 371*b* and 372*b* of the cell region CELL. The lower bonding metals 271*b* and 272*b* and the upper bonding metals 371*b* and 372*b* may be formed of aluminum, copper, tungsten, or the like. Further, the upper bonding metals 371*b* and 372*b* in the cell region CELL may be referred as first metal pads and the lower bonding metals 5271*b* and 5272*b* in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350*c* and a second metal layer 360*c*. For example, the first metal layer 350*c* may be a bit line contact, and the second metal layer 360*c* may be a bit line. In an example embodiment, the bit line 360*c* may extend in a first direction (a Y-axis direction), parallel to the upper surface of the second substrate 310.

In an example embodiment illustrated in FIG. 19, an area in which the channel structure CH, the bit line 360*c*, and the like are disposed may be defined as the bit line bonding area BLBA. In the bit line bonding area BLBA, the bit line 360*c* may be electrically connected to the circuit elements 220*c* providing a page buffer 393 in the peripheral circuit region PERI. The bit line 360*c* may be connected to upper bonding metals 371*c* and 372*c* in the cell region CELL, and the upper bonding metals 371*c* and 372*c* may be connected to lower bonding metals 271*c* and 272*c* connected to the circuit elements 220*c* of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350*b* and a second metal layer 360*b* may be connected to an upper portion of the plurality of cell contact plugs 340 connected to the plurality of word lines 330, sequentially. The plurality of cell contact plugs 340 may be connected to the peripheral circuit region PERI by the upper bonding metals 371*b* and 372*b* of the cell region CELL and the lower bonding metals 271*b* and 272*b* of the peripheral circuit region PERI in the word line bonding area WLBA.

The plurality of cell contact plugs 340 may be electrically connected to the circuit elements 220*b* forming a row decoder 394 in the peripheral circuit region PERI. In an example embodiment, operating voltages of the circuit elements 220*b* of the row decoder 394 may be different than operating voltages of the circuit elements 220*c* forming the page buffer 393. For example, operating voltages of the circuit elements 220*c* forming the page buffer 393 may be greater than operating voltages of the circuit elements 220*b* forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350*a* and a second metal layer 360*a* may be stacked on an upper portion of the common source line contact plug 380, sequentially. For example, an area in which the common source line contact plug 380, the first metal layer 350*a*, and the second metal layer 360*a* are disposed may be defined as the external pad bonding area PA.

Input-output pads 205 and 305 may be disposed in the external pad bonding area PA. Referring to FIG. 19, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220*a*, 220*b*, and 220*c* disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 19, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220*a*, 220*b*, and 220*c* disposed in the peripheral circuit region PERI through a second input-output contact plug 303. In the example embodiment, the second input-output pad 305 is electrically connected to a circuit element 220*a*.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 19, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 500 may include only the first input-output pad 205 disposed on the first substrate 210 or the second input-output pad 305 disposed on the second substrate 310. Alternatively, the memory device 500 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 20:
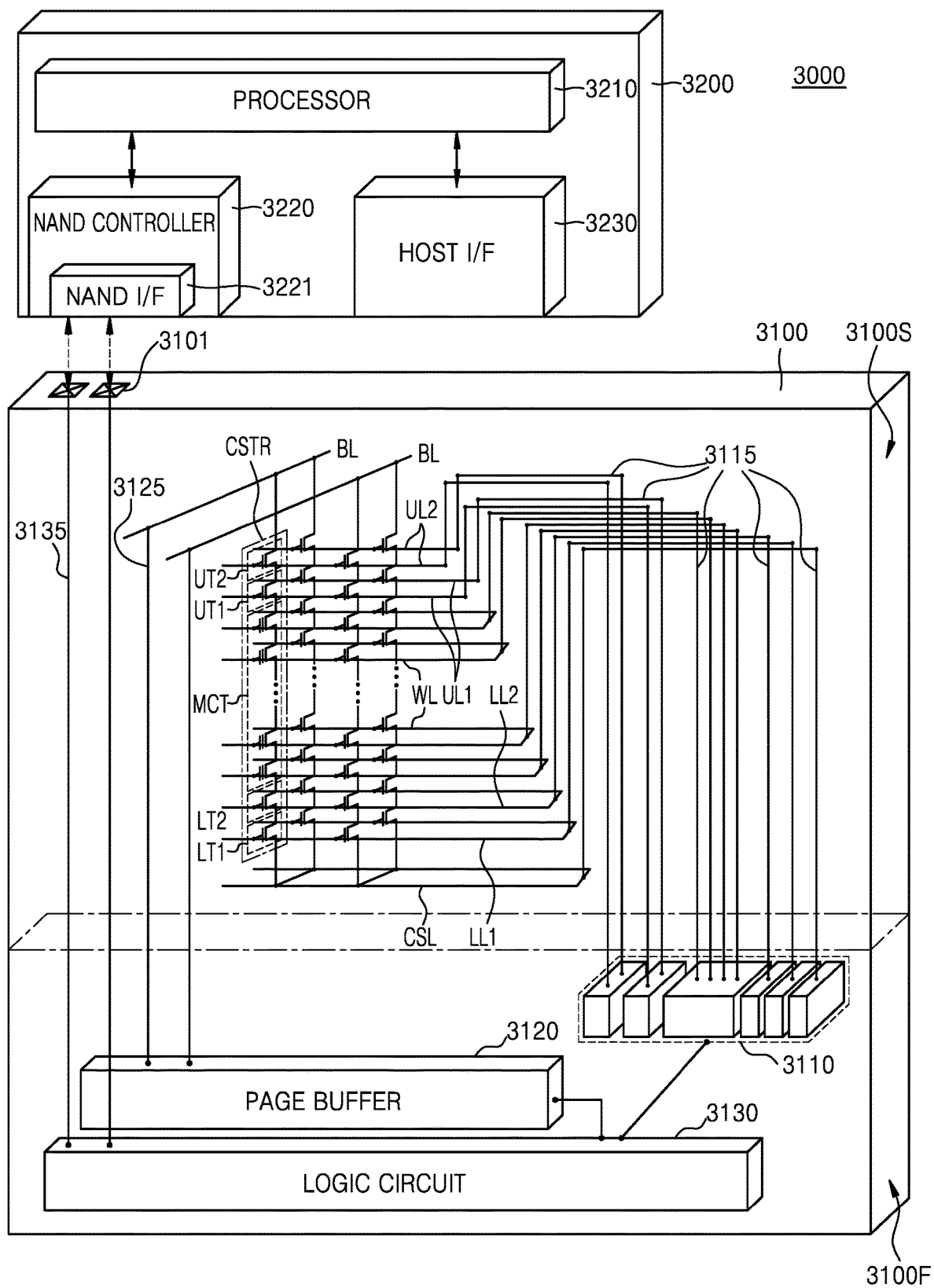
FIG. 20 is a schematic diagram of an electronic system including an IC device, according to example embodiments.

FIG. 20 is a schematic diagram of an electronic system 3000 including an IC device 3100, according to example embodiments. Referring to FIG. 20, the electronic system 3000 according to an example embodiment may include an IC device 3100 and a controller 3200 electrically connected to the IC device 3100. The electronic system 3000 may include a storage device including at least one IC device 3100 or an electronic device including the storage device. For example, the electronic system 3000 may include a solid-state drive (SSD) device, a universal serial bus (USB), a computing system, a medical device, or a communication device, which includes the at least one IC device 3100.

The at least one IC device 3100 may include a non-volatile memory device. For example, the IC device 3100 may include a NAND flash memory device including at least one of structures of the IC devices 10, 100, 200, 300, 400, 500, 1000, 1100, 1200, 1300, 1400, 1500, 1600, and 2000, which have been described above with reference to FIGS. 1 to 19. The IC device 3100 may include a first structure 3100F and a second structure 3100S on the first structure 3100F. In example embodiments, the first structure 3100F may be beside the second structure 3100S. The first structure 3100F may include a peripheral circuit structure including a decoder circuit 3110, a page buffer 3120, and a logic circuit 3130. The second structure 3100S may include a memory cell structure including bit lines BL, a common source line CSL, a plurality of word lines WL, first and second upper gate lines UL1 and UL2, first and second lower gate lines LL1 and LL2, and a plurality of memory cell strings CSTR located between the bit lines BL and the common source line CSL.

In the second structure 3100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously changed according to embodiments.

In example embodiments, the upper transistors UT1 and UT2 may include string selection transistors, and the lower transistors LT1 and LT2 may include ground selection transistors. The first and second lower gate lines LL1 and LL2 may be respectively gate electrodes of the lower transistors LT1 and LT2. The word line WL may be a gate electrode of the memory cell transistor MCT, and the upper gate lines UL1 and UL2 may be respectively gate electrodes of the upper transistors UT1 and UT2.

The common source line CSL, the first and second lower gate lines LL1 and LL2, the plurality of word lines WL, and the first and second upper gate lines UL1 and UL2 may be electrically connected to the decoder circuit 3110 through a plurality of first connection wirings 3115 that extend to the second structure 3100S in the first structure 3100F. A plurality of bit lines BL may be electrically connected to the page buffer 3120 through a plurality of second connection wirings 3125 that extend to the second structure 3100S in the first structure 3100F. In the first structure 3100F, the decoder circuit 3110 and the page buffer 3120 may perform a control operation on at least one of the plurality of memory cell transistors MCT. The decoder circuit 3110 and the page buffer 3120 may be controlled by the logic circuit 3130.

The IC device 3100 may communicate with the controller 3200 through an I/O pad electrically connected to the logic circuit 3130. The I/O pad 3101 may be electrically connected to the logic circuit 3130 through an I/O connection wiring 3135 that extends to the second structure 3100S in the first structure 3100F.

The controller 3200 may include a processor 3210, a NAND controller 3220, and a host interface (I/F) 3230. In some embodiments, the electronic system 3000 may include a plurality of IC devices 3100. In this case, the controller 3200 may control the plurality of IC devices 3100.

The processor 3210 may control all operations of the electronic system 3000 including the controller 3200. The processor 3210 may operate according to predetermined firmware and access the IC device 3100 by controlling the NAND controller 3220. The NAND controller 3220 may include a NAND I/F 3221 configured to process communication with the IC device 3100. A control command for controlling the IC device 3100, data to be written to the plurality of memory cell transistors MCT of the IC device 3100, and data to be read from the plurality of memory cell transistor MCT of the IC device 3100 may be transmitted through the NAND I/F 3221. The host I/F 3230 may provide a communication between the electronic system 3000 and an external host. When a control command is received from the external host through the host I/F 3230, the processor 3210 may control the IC device 3100 in response to the control command.

While the inventive concept has been particularly shown and described with reference to embodiments thereof, it will be understood that various changes in form and details may be made therein without departing from the spirit and scope of the following claims.

What is claimed is:

1. An integrated circuit device, comprising:
a lower substrate;
a peripheral circuit structure comprising a plurality of antenna diodes formed in the lower substrate;
a conductive plate comprising a tile region having a rectangular shape with four vertices and an edge region surrounding the tile region, the conductive plate covering the peripheral circuit structure;
a cell array structure overlapping the peripheral circuit structure with the tile region of the conductive plate therebetween in a vertical direction; and
a plurality of bypass wiring structures connected between the plurality of antenna diodes and the conductive plate,
wherein the plurality of antenna diodes are under portions of the edge region of the conductive plate, which are respectively adjacent to four vertex portions of the tile region of the conductive plate.

2. The integrated circuit device of claim 1, wherein each of the plurality of bypass wiring structures comprises a bypass via contact having an upper surface in contact with a lower surface of the conductive plate and a lower surface in contact with the antenna diode.

3. The integrated circuit device of claim 1, wherein each of the bypass wiring structures comprises:
a bypass via contact having an upper surface in contact with a lower surface of the conductive plate and a lower surface apart from the antenna diode in the vertical direction, and
a middle wiring structure connected between the lower surface of the bypass via contact and the antenna diode.

4. The integrated circuit device of claim 1, wherein the conductive plate includes plate extension unit extending outward from the edge region, and wherein at least some of the plurality of antenna diodes are under the plate extension unit of the conductive plate.

5. The integrated circuit device of claim 4, wherein the plate extension unit comprises four plate extension units respectively extending outward from four corners of the edge region.

6. The integrated circuit device of claim 1, wherein the cell array structure comprises a memory stack, the memory stack comprising a plurality of gate lines stacked on the conductive plate in the vertical direction, a plurality of channel structures passing through the plurality of gate lines in the vertical direction, and a plurality of bit lines on the plurality of channel structures,
the integrated circuit device further comprising a plate contact configured to electrically connect a wiring pattern located at the same vertical level as the plurality of bit lines to the conductive plate, the plate contact having a lower surface in contact with the conductive plate.

7. An integrated circuit device, comprising:
a lower substrate;
a peripheral circuit structure formed in the lower substrate, the peripheral circuit structure comprising a plurality of antenna diodes and a peripheral circuit in a diode region;
a conductive plate comprising a tile region having a rectangular planar shape and an edge region extending along an edge of the tile region and surrounding the tile region, the conductive plate covering the peripheral circuit structure;
a cell array structure overlapping the peripheral circuit structure with the tile region of the conductive plate therebetween in a vertical direction, the cell array structure comprising a memory stack, the memory stack comprising a plurality of gate lines stacked in the vertical direction, a plurality of channel structures passing through the plurality of gate lines in the vertical direction, and a plurality of bit lines on the plurality of channel structures; and
a plurality of bypass wiring structures connected between the plurality of antenna diodes and the conductive plate,
wherein the plurality of antenna diodes are respectively under portions of the edge region of the conductive plate, which are respectively adjacent to four vertex portions of the tile region of the conductive plate.

8. The integrated circuit device of claim 7, wherein the diode region has an L planar shape.

9. The integrated circuit of claim 7, wherein an active region of the lower substrate comprises a first conductive type ion implantation region, and the antenna diode comprises a diode ion implantation region comprising a second conductive type ion implantation region having a different conductive type from the first conductive type ion implantation region.

10. The integrated circuit device of claim 9, wherein each of the plurality of bypass wiring structures comprises a bypass via contact having an upper surface in contact with a lower surface of the conductive plate and a lower surface in contact with the diode ion implantation region.

11. The integrated circuit of claim 9, wherein each of the bypass wiring structures comprises:
a bypass via contact having an upper surface in contact with a lower surface of the conductive plate and a lower surface apart from the antenna diode in the vertical direction, and
a middle wiring structure connected between a lower surface of the bypass via contact and the diode ion implantation region, the middle wiring structure having a multilayered wiring structure.

12. An integrated circuit device, comprising:
a semiconductor substrate having components of a peripheral circuit structure formed in and on a surface of the semiconductor substrate, said peripheral circuit structure comprising a plurality of antenna diodes therein;
a memory cell array structure on at least a portion of the peripheral circuit structure; and
a conductive plate extending between the peripheral circuit structure and the memory cell array structure, said conductive plate electrically connected to current carrying terminals of the antenna diodes within the peripheral circuit structure; and wherein the conductive plate has a generally rectangular planar shape with four corners; and wherein the antenna diodes are arranged into four groups that extend between respective corners of the conductive plate and the semiconductor substrate.

13. The device of claim 12, further comprising bypass wiring structures, which electrically connect the current carrying terminals of the antenna diodes to the conductive plate.

14. The device of claim 12, wherein the memory cell array structure extends on a first portion of the conductive plate, which is surrounded by a second portion of the conductive plate; and wherein the antenna diodes extend between the second portion of the conductive plate and the semiconductor substrate.

15. The device of claim 12, further comprising:
a bit line on the memory cell array; and
an electrically conductive through-hole via extending through an opening in the conductive plate, and electrically connecting the bit line to a portion of the peripheral circuit structure.

16. The device of claim 12, wherein the conductive plate comprises a stacked plurality of layers of electrically conductive materials, which are different from each other.

17. The device of claim 12, wherein the memory cell array structure has a word line cut region therein, which extends at least partially through the memory cell structure to a surface of the conductive plate.

18. The device of claim 12, wherein the plurality of antenna diodes are arranged into first through fourth arrays of antenna diodes having respective first through fourth pluralities of anode terminals that contact respective first through fourth portions of the conductive plate, which are located adjacent first through fourth corners of the conductive plate when viewed from a plan perspective.

* * * * *